(12) United States Patent
Nandakumar et al.

(10) Patent No.: US 11,152,350 B2
(45) Date of Patent: Oct. 19, 2021

(54) DIELECTRIC SPACED DIODE

(71) Applicant: TEXAS INSTRUMENTS INCORPORATED, Dallas, TX (US)

(72) Inventors: Mahalingam Nandakumar, Richardson, TX (US); Alan Erik Segervall, Half Moon Bay, CA (US); Muhammad Yusuf Ali, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/220,793

(22) Filed: Dec. 14, 2018

(65) Prior Publication Data

US 2020/0194422 A1 Jun. 18, 2020

(51) Int. Cl.
*H01L 27/02* (2006.01)
*H01L 27/06* (2006.01)
*H01L 29/06* (2006.01)
*H01L 27/08* (2006.01)
*H01L 27/092* (2006.01)
*H01L 21/266* (2006.01)

(52) U.S. Cl.
CPC ........ *H01L 27/0255* (2013.01); *H01L 21/266* (2013.01); *H01L 27/0629* (2013.01); *H01L 27/0811* (2013.01); *H01L 27/0814* (2013.01); *H01L 27/0928* (2013.01); *H01L 29/0649* (2013.01)

(58) Field of Classification Search
CPC ............. H01L 27/0255; H01L 29/0688; H01L 29/66136; H01L 29/8611–8613; H01L 21/266; H01L 27/0629
See application file for complete search history.

(56) References Cited

U.S. PATENT DOCUMENTS

| | | | |
|---|---|---|---|
| 4,244,752 A * | 1/1981 | Henderson, Sr. | H01L 21/823892 438/449 |
| 6,171,893 B1 * | 1/2001 | Wu | H01L 21/823418 257/E21.619 |
| 7,186,596 B2 * | 3/2007 | Min | H01L 27/0255 257/173 |
| 8,129,782 B2 * | 3/2012 | Knaipp | H01L 29/0878 257/339 |
| 8,659,112 B2 * | 2/2014 | Nandakumar | H01L 21/823412 257/500 |
| 8,912,576 B2 * | 12/2014 | Chung | H01L 29/66113 257/205 |
| 8,941,181 B2 | 1/2015 | Nandakumar et al. | |
| 9,589,959 B2 | 3/2017 | Nandakumar et al. | |
| 2006/0043489 A1 * | 3/2006 | Chen | H01L 27/0255 257/355 |
| 2008/0023767 A1 | 1/2008 | Voldman | |

(Continued)

*Primary Examiner* — Daniel Luke
(74) *Attorney, Agent, or Firm* — Andrew R. Ralston; Charles A. Brill; Frank D. Cimino

(57) ABSTRACT

An electronic device, e.g. integrated circuit, has an n-type region and a p-type region located within a semiconductor substrate, the n-type region and the p-type region each intersecting the substrate surface. A dielectric structure is located directly on the substrate surface. The dielectric structure has first and second laterally opposed sides, with the first side located over the n-type region and the second side located over the p-type region.

21 Claims, 23 Drawing Sheets

(56) References Cited

U.S. PATENT DOCUMENTS

| | | | |
|---|---|---|---|
| 2013/0175549 A1* | 7/2013 | Okumura | H01L 29/66068 |
| | | | 257/77 |
| 2013/0221449 A1* | 8/2013 | Aoyama | H01L 21/26526 |
| | | | 257/402 |
| 2016/0141285 A1* | 5/2016 | Huang | H01L 29/0688 |
| | | | 257/487 |
| 2017/0133361 A1 | 5/2017 | Nandakumar et al. | |

* cited by examiner

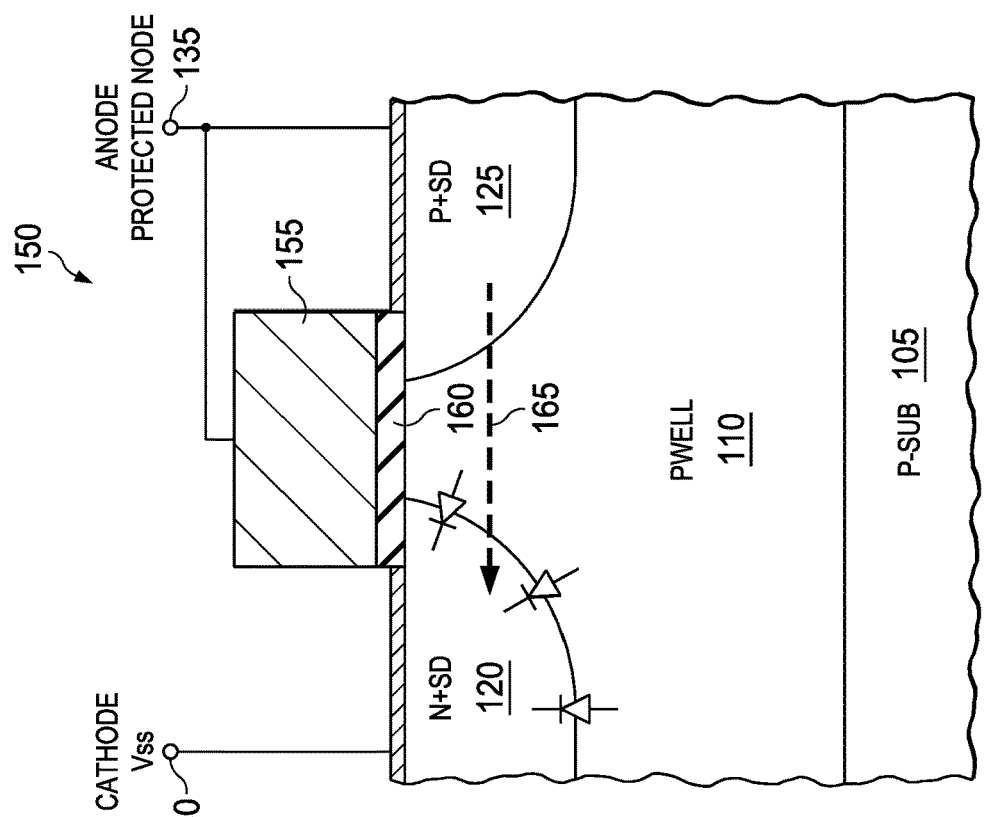
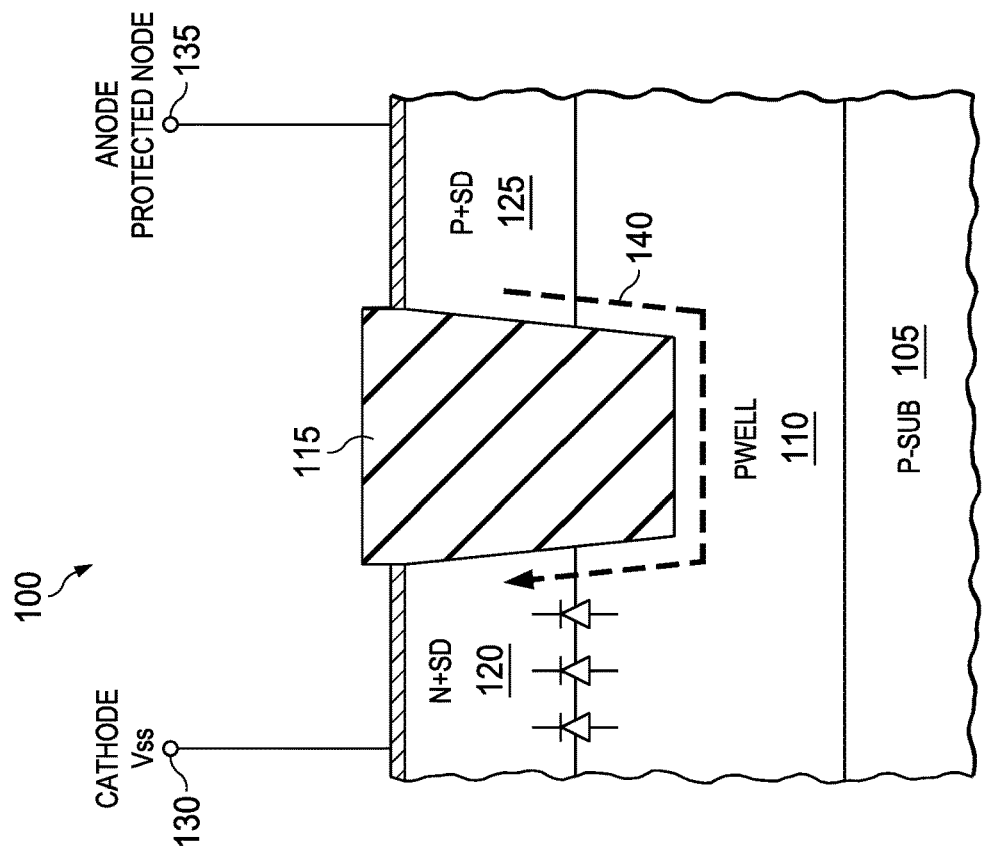
FIG. 1B (PRIOR ART)
FIG. 1A (PRIOR ART)

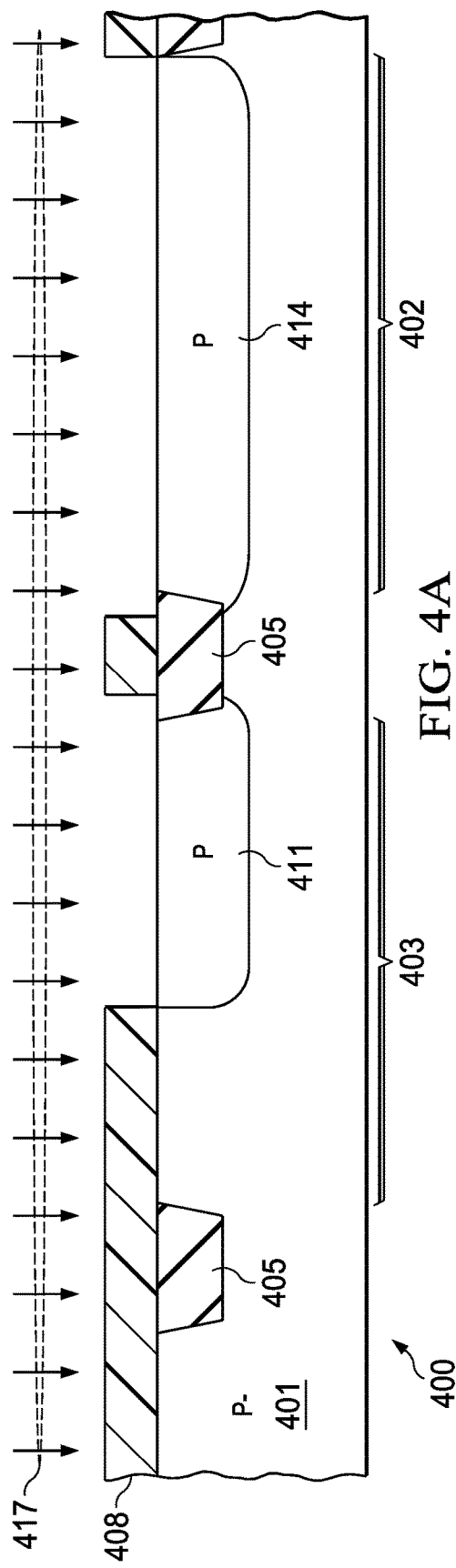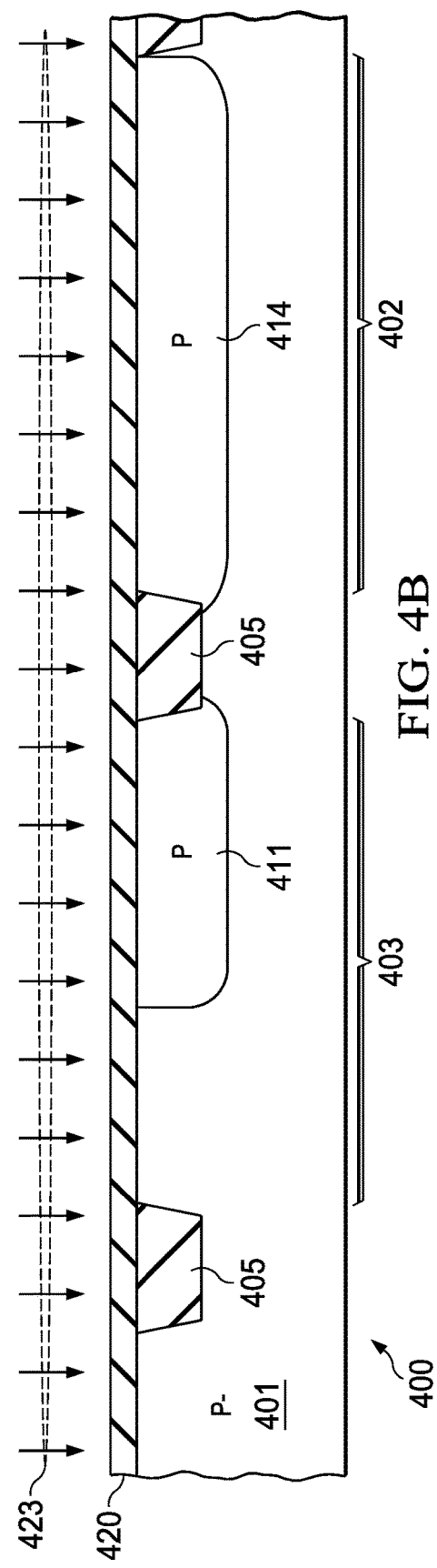

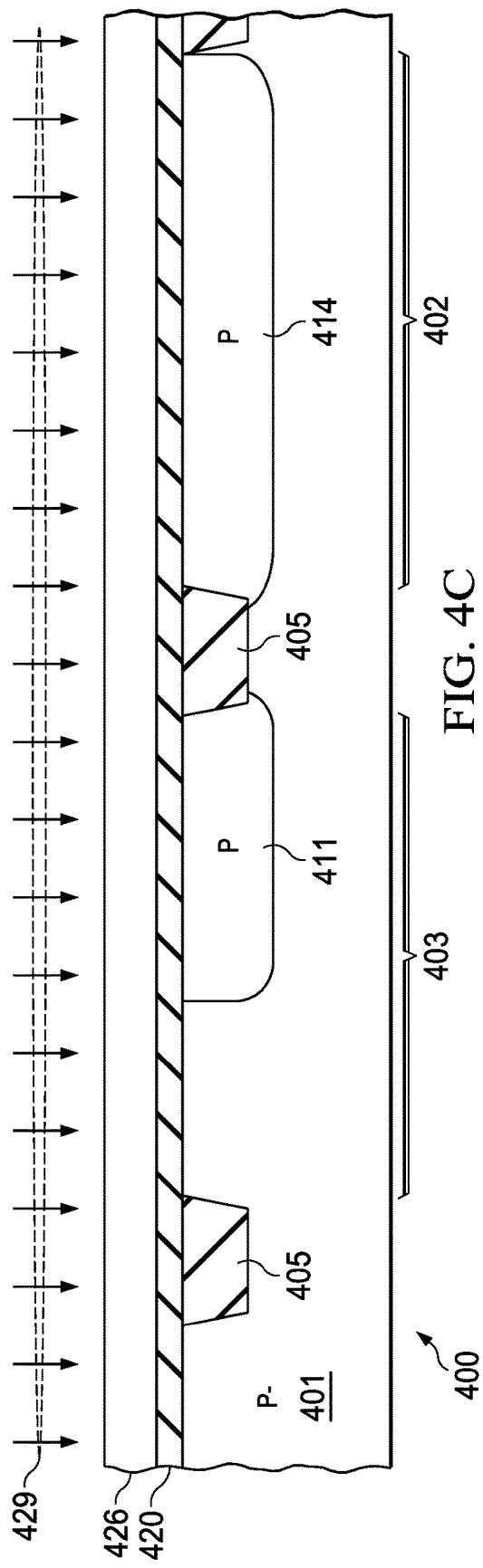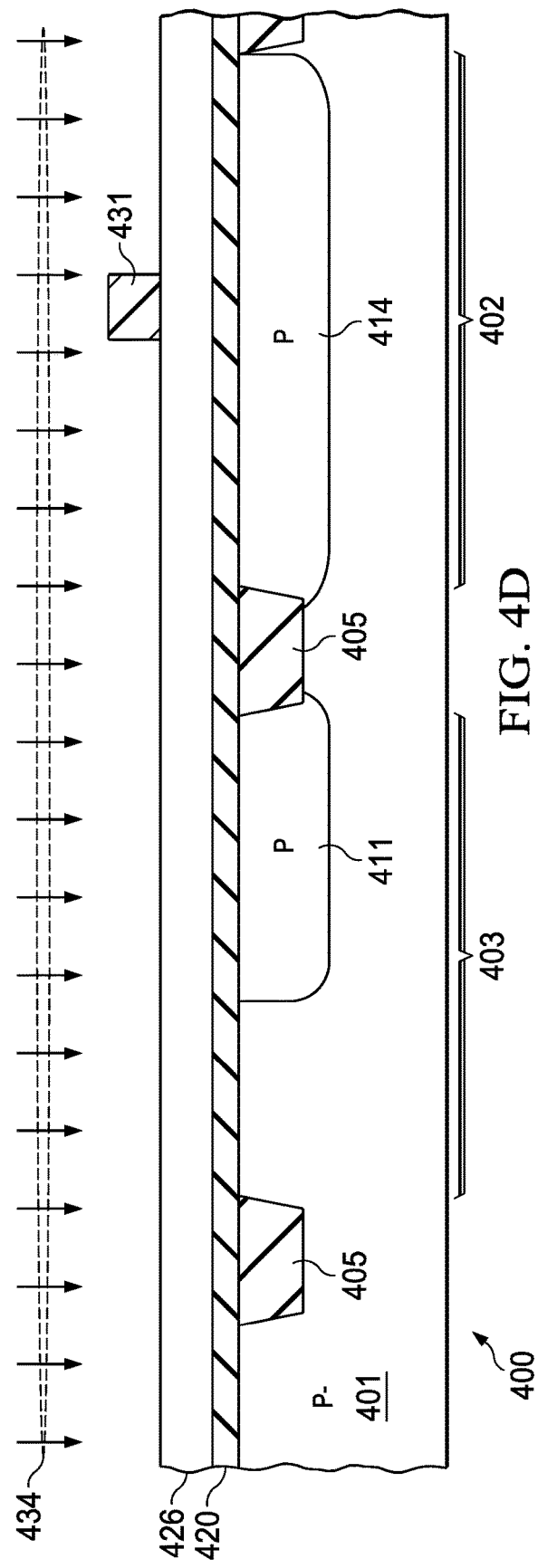

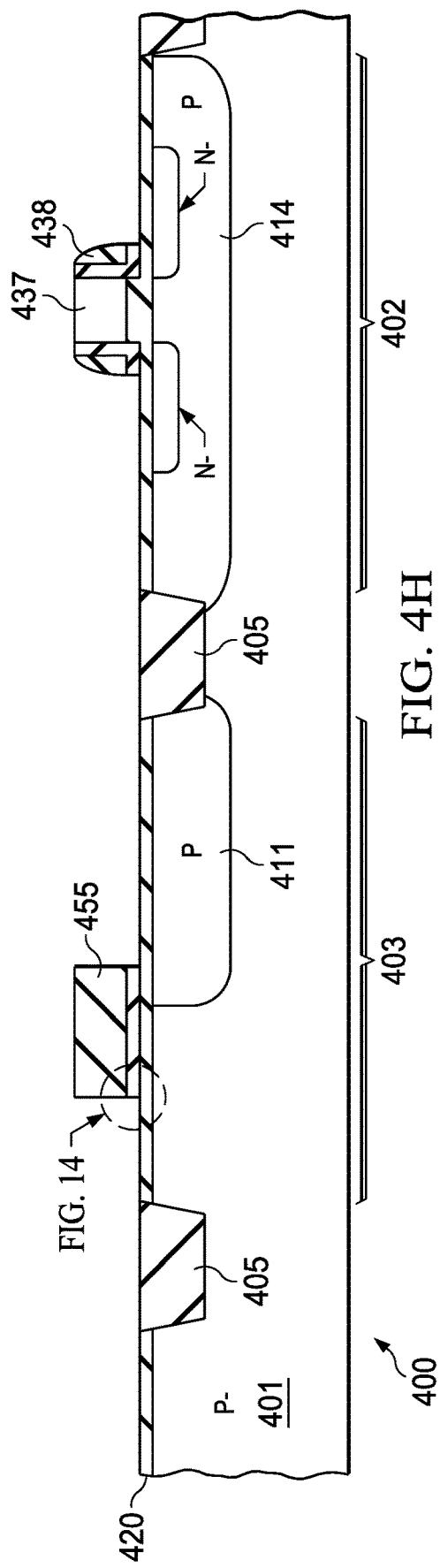
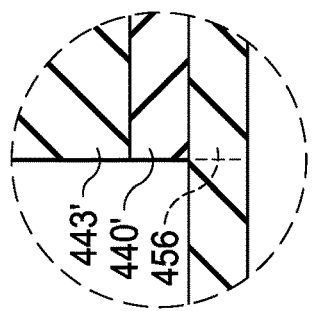
FIG. 4H
FIG. 14

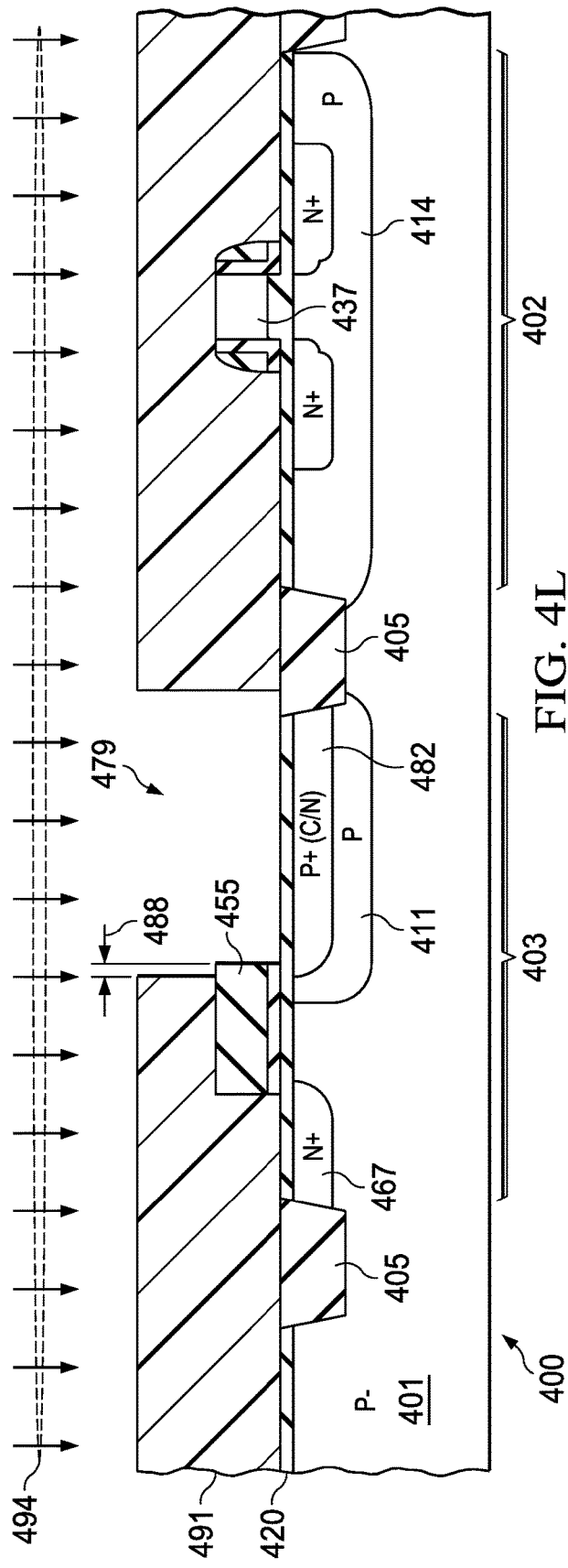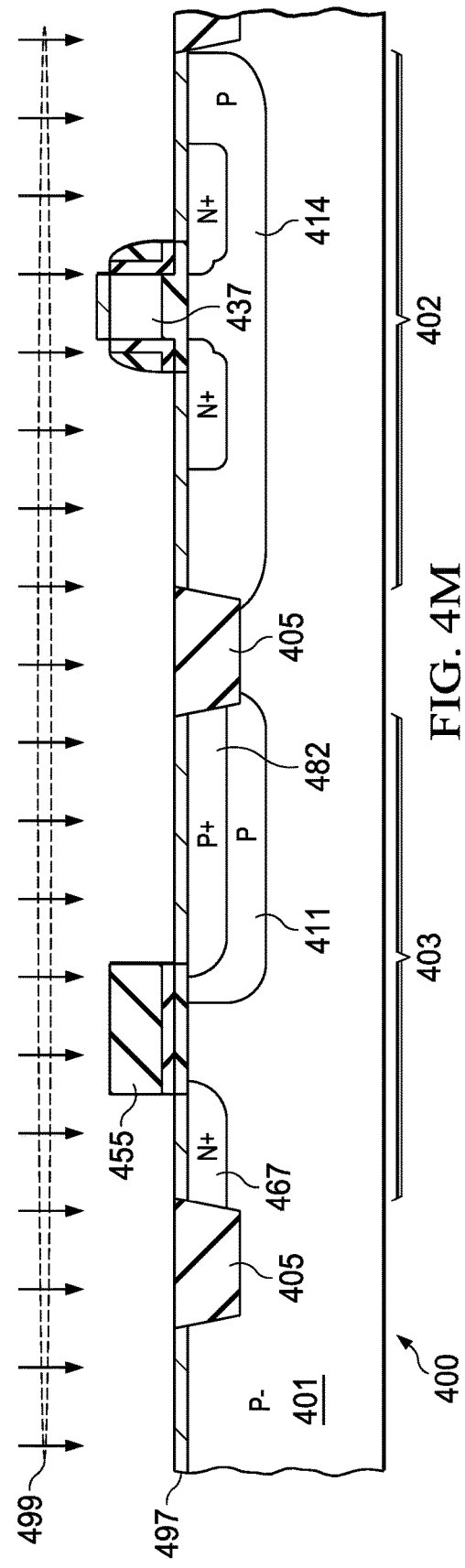

DIELECTRIC SPACED DIODE

CROSS REFERENCE TO RELATED APPLICATIONS

This application is related to U.S. patent application Ser. No. 16/185,657, filed on Nov. 9, 2018, the entirety of which is hereby incorporated herein by reference. This application is further related to U.S. Pat. No. 8,941,181, the entirety of which is hereby incorporated herein by reference.

FIELD

This disclosure relates to the field of semiconductor devices, and more particularly, but not exclusively, to diodes with reduced junction capacitance that may be used in an integrated circuit (IC), and in some applications for electrostatic discharge protection of the IC.

BACKGROUND

Integrated circuits often include electrostatic discharge (ESD) protection circuitry designed to dissipate charge from an ESD strike at an input/output (I/O) node. Such circuits may include one or more diodes configured to shunt ESD current from the I/O node to rails of a power supply to dissipate the current. In such applications, it is desirable that the diode responds rapidly to the ESD strike to limit the magnitude and duration of voltage stress on sensitive device elements, such as gate dielectric layers. However, capacitance associated with the P-N junction of the diode may be relatively large in some integrated circuits due to heavily doped P and or N regions and a large doping gradient. Such diode capacitance is undesirable in ESD applications because it slows down the switching speed of the circuit it is designed to protect.

SUMMARY

The inventors disclose various methods and devices that may be beneficially applied to manufacturing integrated circuits (ICs) including diodes with improved operating parameters, e.g. lower junction capacitance. While such embodiments may be expected to provide improvements in reliability of such ICs, no particular result is a requirement of the described invention(s) unless explicitly recited in a particular claim.

The present disclosure introduces an electronic device, e.g. an integrated circuit. In various embodiments the device includes a semiconductor substrate having a surface. An n-type region and a p-type region are located within and intersect the substrate surface. A dielectric structure, e.g. a spacer, is located on or over the substrate surface. The dielectric structure has first and second laterally opposed sides, with the first side located over the n-type region and the second side located over the p-type region. In various embodiments the n-type region and the p-type region are configured to operate as a diode. In some such embodiments the diode is configured to operate as an ESD protection diode of the integrated circuit.

Another embodiment provides a method, e.g. of forming an electronic device. The method includes forming an n-type region and a p-type region within a semiconductor substrate, the n-type region and the p-type region each intersecting a surface of the substrate. A dielectric structure with first and second laterally opposed sides is formed on or over the substrate surface such that the first side is located over the n-type region and the second side is located over the p-type region. In some embodiments a dopant is implanted into the n-type region or the p-type region through an opening in an implant mask that covers substantially all of a top surface of the dielectric structure. The opening has a side located over the dielectric structure that is offset from a side of the dielectric structure such that no more than about 25% of a lateral width of the dielectric structure is exposed during the implant.

Yet another embodiment provides a method, e.g. of forming an electronic device. A dielectric structure, e.g. a spacer, is formed on a semiconductor substrate surface between an n-type region and a p-type region within the substrate. A resist layer is formed over a first side and a top surface of the dielectric structure such that an opening in the resist layer has a side located over the dielectric structure. The side of the opening is offset from a side of the dielectric spacer located within the opening by a nonzero distance. A dopant is implanted through the opening into the semiconductor substrate adjacent the dielectric structure.

BRIEF DESCRIPTION OF THE VIEWS OF THE DRAWINGS

FIGS. 1A and 1B illustrate two conventional spaced diode elements, an STI-spaced diode (FIG. 1A) and a gate-spaced diode (FIG. 1B);

FIG. 14 shows a detail view of a portion of FIG. 4H.

DETAILED DESCRIPTION

Figure 3:
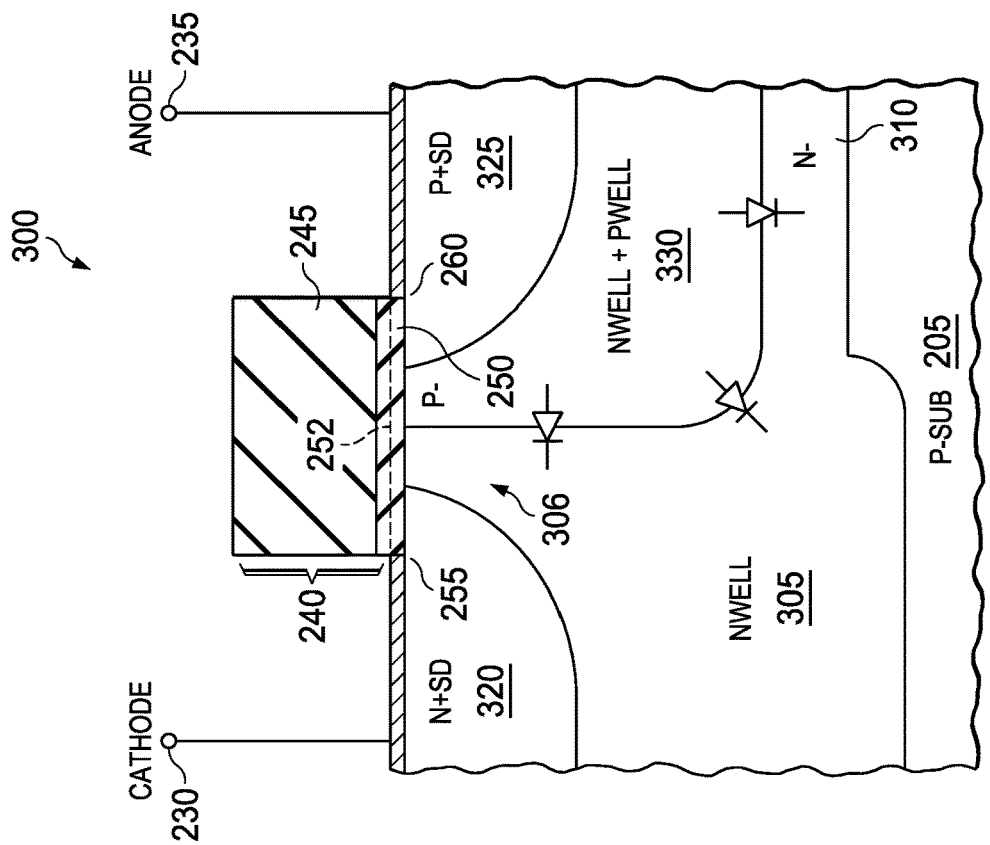
FIG. 3 illustrates a second diode element according another example embodiment in which a dielectric structure spaces apart n-type and p-type regions of the diode, the n-type and p-type regions being located in an n-well of a substrate.

The present disclosure is described with reference to the attached figures. The figures may not be drawn to scale and they are provided merely to illustrate the disclosure. Several aspects of the disclosure are described below with reference to example applications for illustration, in which like features correspond to like reference numbers. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events may be required to implement a methodology in accordance with the present disclosure.

Some ESD protection diodes include isolation to create a nonconductive barrier between a p-type region and an n-type region. FIGS. 1A and 1B present two examples that include some conventional features, including a shallow trench isolation (STI)-spaced ESD (STI-ESD) diode 100 (FIG. 1A) and a gate-spaced ESD (GS-ESD) diode 150 (FIG. 1B) each formed over a p-type substrate 105. Referring to FIG. 1A, the STI-ESD diode 100 includes a shallow dielectric trench 115 between an n-type region 120 and a p-type region 125. The regions 120, 125 are located in a p-well 110, and may be formed coincident with source/drain implants of MOS transistors formed elsewhere over the substrate 105. Diode symbols schematically illustrate the distributed diode provided by the junction between the p-well 110 and the n-type region 120. A cathode terminal 130 connects the n-type region 120 to a low-impedance current path, e.g. a positive rail of a power-supply, and an anode terminal 135 connects the p-type region 125 to a circuit node to be protected. In the event that an ESD strike occurs at the anode terminal 135, the distributed diode shunts ESD current from the protected circuit node to the power supply node, thereby protecting the circuit. The shunt current may follow a path 140 shown schematically between the n-type region 120 and the p-type region 125, around the trench 115.

Regarding the GS-ESD diode 150 in FIG. 1B, isolation between the n-type region 120 and p-type region 125 is provided by a portion of the p-well 110 located between the regions 120, 125. N-type and p-type implants are blocked by a gate electrode 155 and gate dielectric 160 located between the regions 120, 125. The regions 120, 125 may have a qualitatively different profile relative to the STI-ESD diode 100, but operation is substantially similar. However, the lateral separation between the n-type region 120 and p-type region 125, which is defined by the gate electrode 155, is typically much smaller, and hence the shunt current path 165 between the regions 120 and 125 may be shorter. Referring further to the GS-ESD diode 150 of FIG. 1B, the anode terminal 135 is shown connected to the gate electrode 155. Alternately, the gate electrode 155 can also be connected to the cathode terminal 130. Either of these configurations maintains the gate electrode 155 at a known potential, and in particular limits that potential to the voltage of the power supply node to which it is tied.

Some prior art variants of the STI-ESD diode 100 and the GS-ESD diode 150 remove the p-well 110 under the n-type region 120. Such variants are examples of a class of diodes referred to herein as compensated well (CW) ESD diodes. This modification has the effect of placing the n-type region 120 in an unmodified portion of the p-type substrate 105. Because the substrate 105 has a lower dopant concentration than the p-well 110, this configuration results in a larger space-charge region associated with the junction between the n-type region 120 and the p-type substrate 105. The larger space-charge region reduces the capacitance associated with the junction, thereby reducing the capacitive load on the protected circuit node. The lower capacitance is expected to allow higher-frequency operation of some circuits for which high-frequency cutoff is determined at least in part by the capacitive loading of the protected node.

Additional details of some previous improvements of ESD diodes may be found in U.S. Pat. No. 8,941,181, incorporated herein by reference in its entirety.

Figure 2:
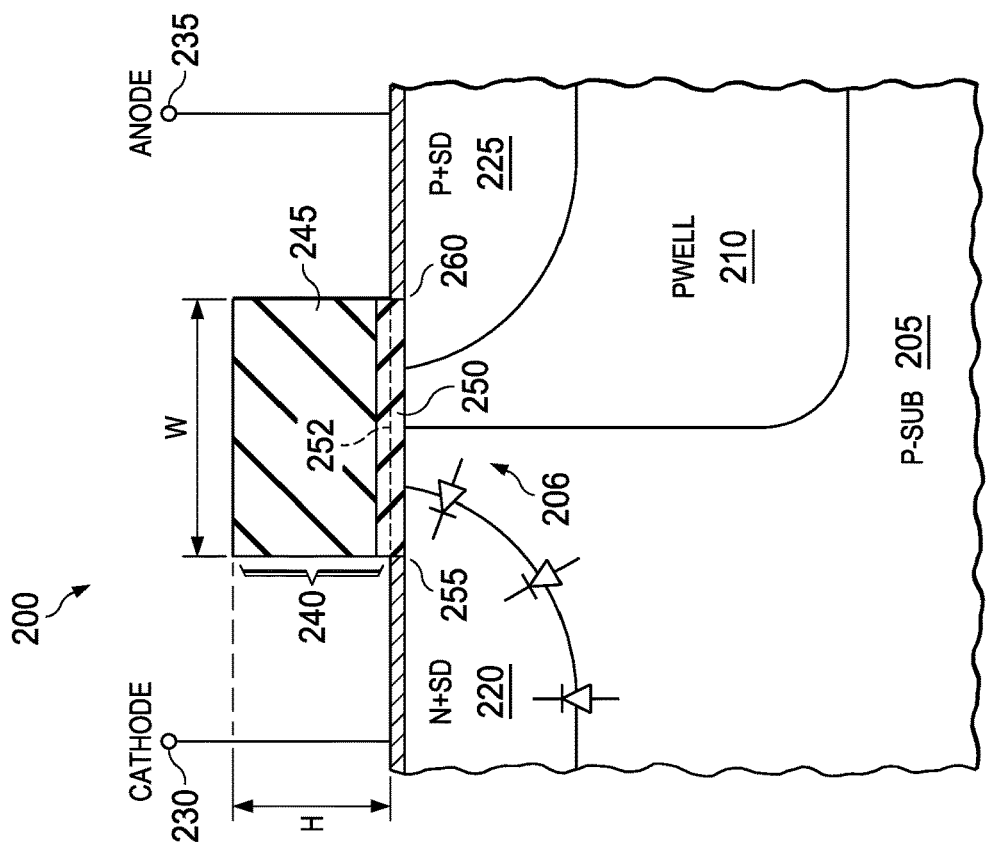
FIG. 2 illustrates a first diode element according one example embodiment in which a dielectric structure spaces apart n-type and p-type regions of the diode, the p-type region being located in a p-well of a substrate.

FIG. 2 illustrates a diode element 200 according to various embodiments. The diode element 200 may be suitable for use as an ESD protection diode in an IC, but embodiments are not limited to that particular use. The diode element 200 includes a substrate 205, e.g. a lightly-doped p-type silicon wafer, in which a p-type region 210 (sometimes referred to as a p-type well 210 or p-well 210), an n-type region 220 and a p-type region 225 have been formed. In various embodiments the p-type region 210 has a lower concentration of majority carriers, e.g. mobile holes, than does the p-type region 225. For example, the substrate 205 may be doped with 1E13-1E16 $cm^{-3}$ boron atoms, the p-type region 210 may be doped with 1E17 $cm^{-3}$ boron atoms, the n-type region 220 may be doped with 1E20-5E21 $cm^{-3}$ phosphorous atoms, and the p-type region 225 may be doped with 1E20-5E21 $cm^{-3}$ boron atoms.

The n-type region 220 is connected to a cathode terminal 230 that may be connected to a low-impedance path to ground. The p-type region 225 is connected to an anode terminal 235 that may be connected to a protected node, e.g. in input/output (I/O) terminal of an IC. The regions 220, 225 may optionally be formed during source and drain implants that form MOS transistors elsewhere on the substrate 205. Thus, the n-type region 220 may be referred to as an NSD region 220, and the p-type region 225 may be referred to as a PSD region 225. The substrate 205 may be a lightly doped substrate, e.g. a silicon wafer. Optionally the p-well 210 may be omitted. Because the regions 220, 225 are formed in an underlying p-type material (p-type substrate 205 or p-well 210) the diode element 200 may be referred to as a p-well ESD diode. In this example embodiment the p-well 210 is implemented as a compensated well, e.g. the NSD region 220 is formed in the lightly-doped substrate 205, leaving an unmodified portion 206 of the substrate 205 located between the p-well 210 and the NSD region 220. With respect to the substrate 205, "unmodified" means the concentration of dopant species in the substrate 205 is not substantially different than a bulk, as-received dopant concentration in portions of the substrate spaced apart from active areas.

In spite of the reduced junction capacitance provided by the CW ESD diodes exemplified by FIG. 1, further reduction of junction capacitance is desirable, e.g. to further reduce capacitive loading on the protected circuit node. The inventors have realized that some of the capacitance seen by the protected circuit node is attributable to capacitance between the n-type region 120 or the p-type region 125 and the portion of the gate electrode 155 that overlaps these regions. This capacitance is referred to herein as "gate-edge capacitance". (In a complementary configuration, not shown, the diode may be formed in an n-well, in which case the gate edge capacitance may be caused by capacitance between the gate and the p-type region.) Embodiments of the disclosure benefit from recognition by the inventors that gate-edge capacitance may be reduced or eliminated by replacing the gate with a dielectric spacer. Furthermore, the inventors have determined that such a spacer may be realized at no additional cost in some embodiments by using a silicide block dielectric layer that is already present in some process flows.

Thus the diode element 200 includes a dielectric layer 240, more generally referred to as a dielectric structure 240, is located over the substrate 205 and the substrate portion 206 at the surface of the substrate 205, the p-well 210, the NSD region 220 and the PSD region 225. (For brevity hereafter, these surfaces may be referred to collectively as the "substrate surface".) The dielectric structure 240 includes a first dielectric layer 245 located over an optional second dielectric layer 250. Without implied limitation the first dielectric layer 245 may be referred to as the upper dielectric layer 245 and the second dielectric layer 250 may be referred to as the lower dielectric layer 250. The lower dielectric layer 250 is located directly on the substrate surface. The lower dielectric layer 250 may include a noncontiguous portion of a thermally grown gate dielectric layer, e.g. silicon dioxide. Herein, a "gate dielectric layer" is defined as a thermally grown oxide of the underlying substrate material that is used in some portions of the IC of which the diode element is a part as a gate dielectric of a MOS transistor. The lower dielectric layer 250 may also optionally include a noncontiguous portion of a subsequently formed dielectric layer, e.g. a plasma-deposited oxide layer. A dashed interface 252 represents the delineation of these two layers within the dielectric structure 240 according to such embodiments. The upper dielectric layer 245 may be another dielectric layer used in forming MOS transistors elsewhere on the substrate 205. As described further below, the upper dielectric layer 245 may be a nitrogen-containing dielectric layer, such as SiN or SiON. For example, the upper dielectric layer 245 may be a noncontiguous portion of a dielectric layer used to form gate sidewalls, or to block silicide formation on portions of the substrate. Without limitation, this layer may be referred to as a silicide block layer, or SiBLK. A diode formed consistent with the diode element 200 may then be referred to as an "SiBLK-spaced diode". The dielectric structure 240 may be referred to without implied limitation as an "SiBLK spacer".

The SiBLK spacer 240 has a height H and a width W. The height is the sum of the upper dielectric layer 245 thickness and the lower dielectric layer 250 thickness. These layer thicknesses are not limited to any particular value, but may be determined by the process flow used to produce the IC of which the diode element 200 is a part. For example, the lower dielectric layer 250 may include a portion of a dielectric layer used form a MOS gate oxide, and may also include a thin oxide layer optionally deposited over a gate oxide layer after a polysilicon gate etch process. In some embodiments the total thickness of the lower dielectric layer 250 may be within a range from about 5 nm to about 30 nm. As mentioned, the first gate dielectric layer may be a SiBLK layer comprising, e.g. SiN or SiON. In some embodiments the SiBLK layer may have a thickness within a range from about 10 nm to about 100 nm. Thus in various embodiments the thickness H may be within a range from about 15 nm to about 130 nm. This range may be expected to vary depending on device scaling.

The width W may be selected to result in a desired spacing between the NSD region 220 and the PSD region 225, and is thus design-dependent in general. In some embodiments a width of about 350 nm to about 450 nm may provide acceptable device performance. This value also is expected to scale with overall device scaling. Due to physical and current technical limitations it is expected that a manufacturable lower limit of the width is about 100 nm, though this limit may decrease with improvements in process technology.

As described further below, the SiBLK spacer 240 may help define the space between the NSD region 220 and the PSD region 225. In combination with an NSD photoresist implant mask and a PSD photoresist implant mask, n-type dopants may be selectively implanted in the NSD region 220 and p-type dopants may be selectively implanted into the PSD region 225. Thus the dielectric structure may act as a spacer by limiting the lateral extent of the NSD region 220 and PSD region 225 to preserve the space between these regions underneath the SiBLK spacer 240.

A first side 255 of the SiBLK spacer 240 is located over the NSD region 220, and a laterally opposing second side 260 of the SiBLK spacer 240 is located over the PSD region 225. Thus the SiBLK spacer 240 partially overlaps each of the NSD region 220 and the PSD region 225. While not electrically active, the SiBLK spacer 240 acts similarly to a gate structure in a MOS transistor, or the gate electrode 155 in the GS-ESD diode 150, in the sense that the SiBLK spacer 240 blocks dopants from the implants that form the NSD region 220 and the PSD region 225 from the substrate under the SiBLK spacer 240, thus providing lateral separation of the P-N junction of the diode element 200. As described further below, the SiBLK spacer 240 in combination with NSD and PSD resist masks may also beneficially shield the p-n junction from co-implants (e.g. carbon, nitrogen) used to control the diffusion of n-type and p-type dopants in the NSD and PSD regions (wherever they are used in the IC). Such dopants may increase the capacitance of the p-n junction, undesirably increasing the capacitive load of the diode element 200.

Because the SiBLK spacer 240 is nonconductive, there is no connection between the anode terminal 235 and the SiBLK spacer 240, and no parasitic capacitance associated with the overlap of the SiBLK spacer 240 and the NSD region 220. While the remaining junction capacitance between the NSD region 220 and the substrate 205 is expected to be unchanged relative to otherwise similar gate-spaced ESD diodes, the incremental reduction of capacitive loading on the protected node is expected to improve various relevant performance metrics. In particular the overshoot of voltage on the protected circuit node may be reduced several percent, thus reducing gate dielectric stress in MOS devices connected to the protected circuit node. Because the effect of gate dielectric stress is understood to highly nonlinear, e.g. exponential, this voltage overshoot reduction is expected to result in a significant improvement of device survival rate in the event of an ESD strike on the protected circuit node.

FIG. 3 illustrates another embodiment of a diode element 300, in which an n-type region 305, sometimes referred to as an n-type well 305 or n-well 305, is located in the substrate 205. The diode element 300 is similar in form to the diode element 200, including an n-type region 320, sometimes referred to as NSD region 320, and a p-type region 325, sometimes referred to as a PSD region 325. The NSD region 320 is formed directly in the n-well 305, while the PSD region 325 is formed in an optional p-type region 330, sometimes referred to as a p-type well, or p-well, 330. The p-well 330, if present, may be formed by implanting sufficient p-type dopant into the n-well 305 to convert the implanted portion from n-type to p-type. A lightly doped n-type region 310 may result from a distribution tail of p-type dopant that is not sufficient to change the conductivity type of the n-well 305 from n-type to p-type. The net doping of the p-well 330 may result in a lightly-doped p-type characteristic, thereby increasing the width of the junction between the PSD region 325 and the NSD region 320 and lowering the junction capacitance. In a nonlimiting embodiment the n-well region 305 may be doped with 1E18-2E18 cm$^{-3}$ phosphorous atoms, the n-type region 320 may be doped with 1E20-5E21 cm$^{-3}$ phosphorous atoms, the p-type region 325 may be doped with 1E20-5E21 cm$^{-3}$ boron atoms, and the p-type region 330 may be doped with 1E18 cm$^{-3}$ boron atoms and 1E18-2E18 cm$^{-3}$ phosphorous atoms. This tailoring of the well doping is another example of the compensated well.

A portion 306 of the n-well 305 is located between the NSD region 320 and the PSD region 325. The SiBLK spacer 240 is located on the surface of the substrate 205 such that the lower dielectric layer 250 is located directly on the n-well portion 306 and the p-well 330. The first side 255 of the SiBLK spacer 240 is located over the NSD region 320, and the laterally opposing second side 260 is located over the PSD region 325. Diode schematic symbols illustrate the functional nature of the junction. In contrast to the diode element 200, the diode overshoot of the diode element 300 is expected to be associated with the capacitance of the junction between the n-well 305 and the p-well 330, if present, or between the n-well 305 and the PSD region 325 if the p-well 330 is not present. As described briefly above, the presence of the stabilizing co-implants (e.g., carbon, nitrogen) near the junction with the PSD region 325 may lead to excess capacitance and result in voltage overshoot in an ESD event. Various described embodiments may reduce or eliminate the excess capacitance attributable to C/N dopant at the junction, thereby reducing resulting voltage overshoot, but physically blocking C/N implant below the SiBLK spacer 240. While other materials, e.g. polysilicon, could provide this blocking effect, such alternatives may increase the capacitance of the diode by coupling the electric field between the PSD region 325 and the NSD region 320. The relatively lower dielectric permittivity of the SiBLK spacer 240 reduces such coupling while still providing the advantageous blocking effect.

Figure 11A:
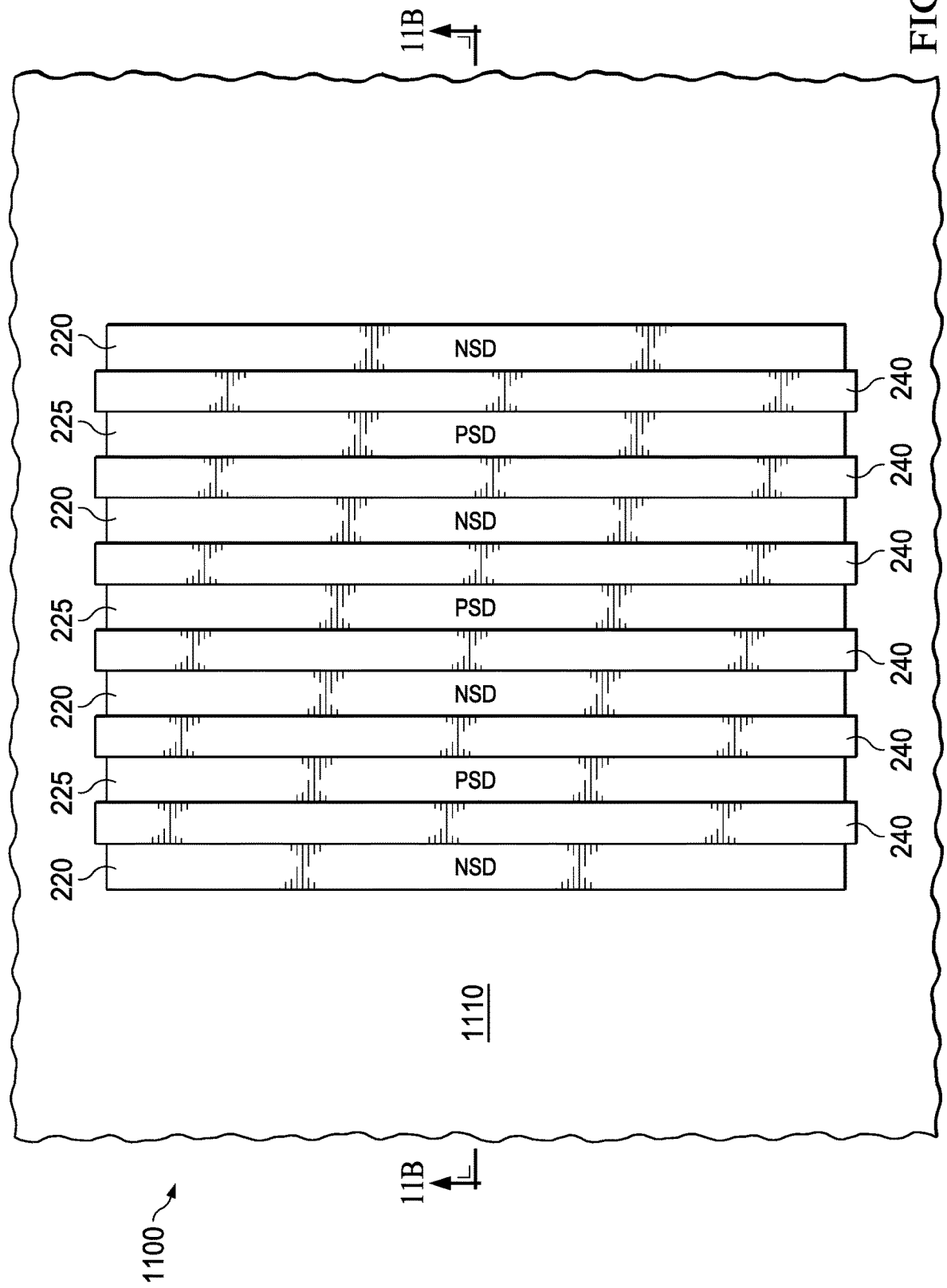
FIGS. 11A and 11B illustrate aspects of an interdigitated diode according to various described embodiments.
Figure 11B:
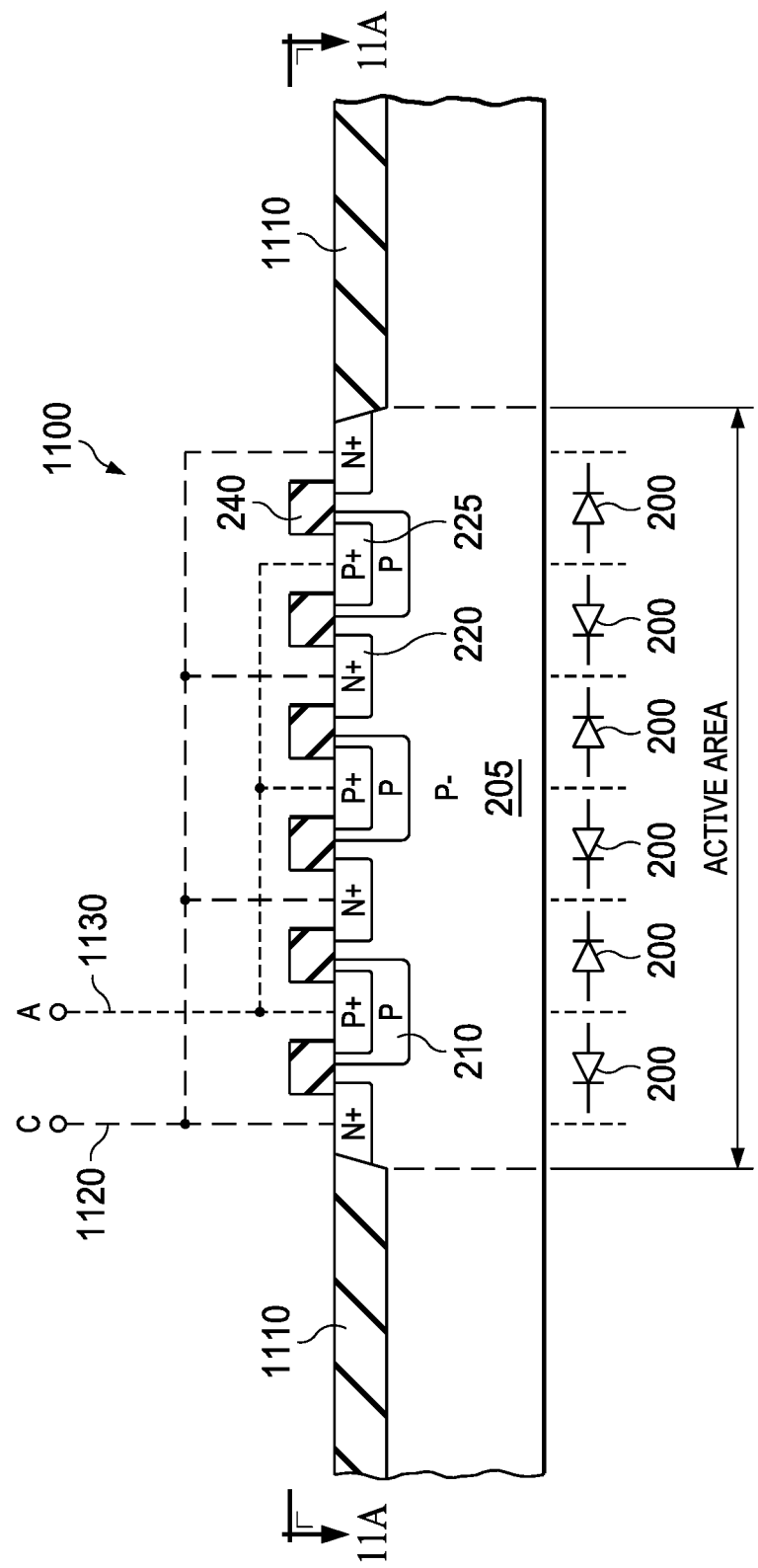

FIG. 11A presents a plan view of an electronic device 1100, for example a diode, and sometimes referred to as diode 1100, and FIG. 11B shows a corresponding sectional view, according to one example embodiment that includes the optional p-well 210. Both figure views are described concurrently in the following discussion. This embodiment is described without limitation being based on the diode element 200, e.g. a SiBLK-spaced diode. The device 1100 may be used in any suitable application, but may be particularly useful in ESD protection applications due to reduced junction capacitance as previously described.

The device 1100 is surrounded on all sides by a field dielectric 1110, e.g. trench isolation oxide. The device 1100 is described with reference to like features of FIG. 2. The diode 100 includes n-type regions 220, e.g. NSD strips, alternating with p-type regions 225, e.g. PSD strips. An instance of the dielectric structure 240 is located between each n-type region 220 and a neighboring p-type region 225. The n-type regions 220 are each connected to a cathode terminal 1120, and each p-type region 225 is connected to an anode terminal 1130. Suitable metallic interconnects and ohmic contacts, symbolized by dashed lines, may be used to implement connections from the terminals 1120, 1130 to their respective regions 220, 225. One n-type region 220, one p-type region 225 and one dielectric structure 240 form a distributed diode running the length of the device 1100. Multiple such distributed diodes connected in parallel by the interconnects may provide an ESD protection diode with an area that may be scaled as desired for a particular implementation.

Referring more specifically to FIG. 11B, a diode schematic symbol between each pair of regions 220, 225 indicates the orientation of the distributed diodes, referred to as 200 reflecting the representative configuration of the diode element 200 (FIG. 2). The anodes of each pair of neighboring diodes 200 that share a p-type region 225 are connected by virtue of sharing that p-type region 225. Similarly, the cathodes of each pair of neighboring diodes 200 that share an n-type region 220 are connected by virtue of sharing that n-type region 220.

Figure 12:
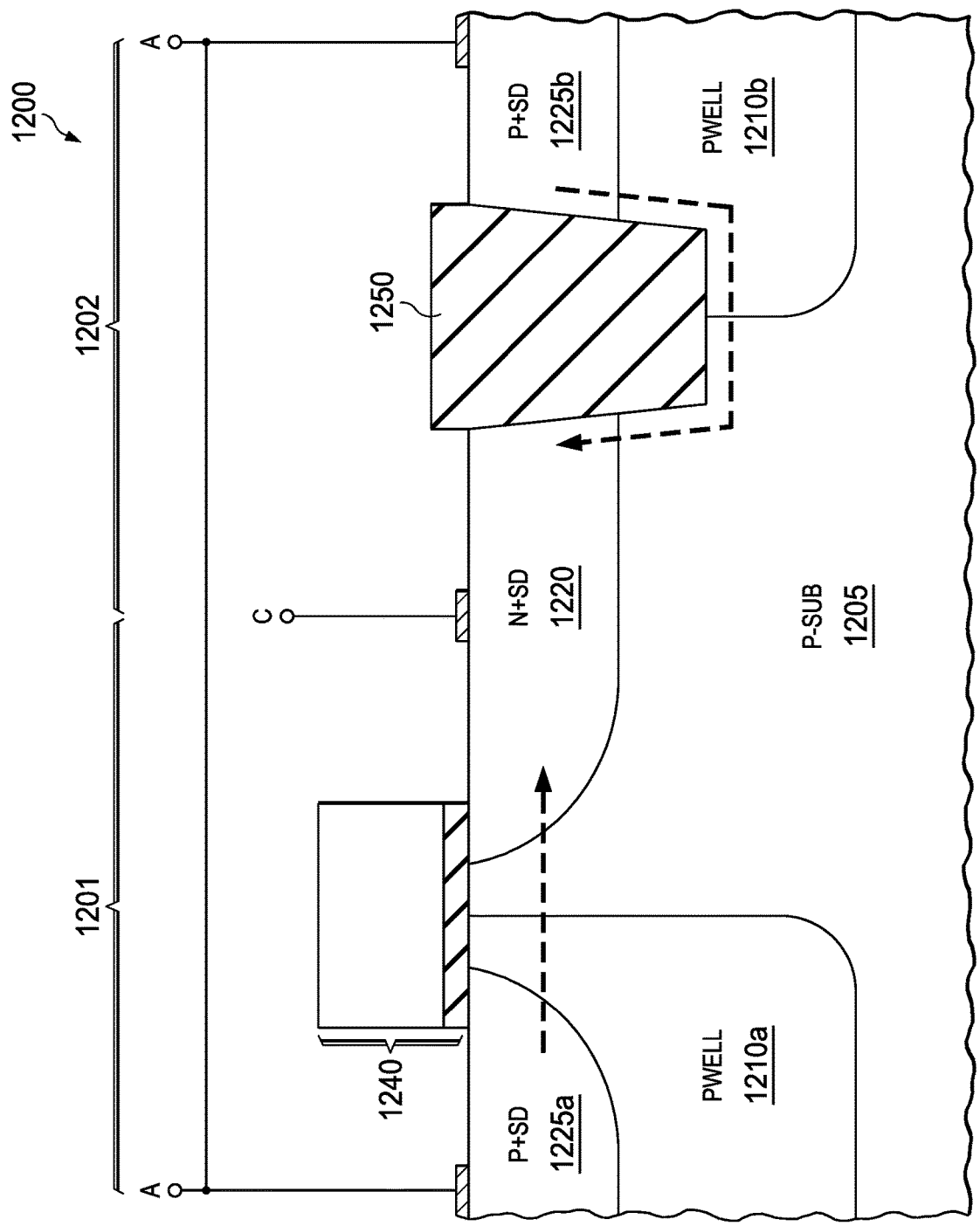
FIG. 12 illustrates a sectional view of a hybrid diode element that includes a dielectric-spaced diode element and an STI-spaced diode element.

FIG. 12 illustrates a parallel diode element 1200 that includes an SiBLK-spaced diode element 1201 and an STI-spaced diode element 1202. Renumbered features of the diode element 200 are shown in one embodiment as described with respect to FIG. 2, including a lightly-doped p-type substrate 1205, p-wells 1210a, 1210b, an n-type (NSD) region 1220, P-type (PSD) regions 1225a, 1225b and an SiBLK spacer 1240. The STI-spaced diode element 1202 includes an STI dielectric structure 1250 that isolates the NSD region 1220 from the PSD region 1225b. The PSD regions 1225a, 1225b may optionally be omitted in some embodiments. In a periodic structure in which the diode element 1200 is a unit cell, the PSD region 1225a from one unit cell joins the PSD region 1225b from a neighboring unit cell, and the combined PSD region is referred to as PSD region 1225. Similarly, combined p-wells 1210a, 1210b of two neighboring unit cells is referred to as p-well 1210. An anode terminal connects to the PSD regions 1225a, 1225b, and a cathode terminal connects to the NSD region 1220, the connections being made by respective ohmic silicide connections to the semiconductor surface. Thus the diode elements 1201 and 1202 are configured to operate in parallel. Representative current flow to the cathode from the PSD regions 1225a and 1225b (anodes) to the NSD region 1220 is shown by dashed lines reflecting the parallel operation of the diode element 1200.

Figure 13A:
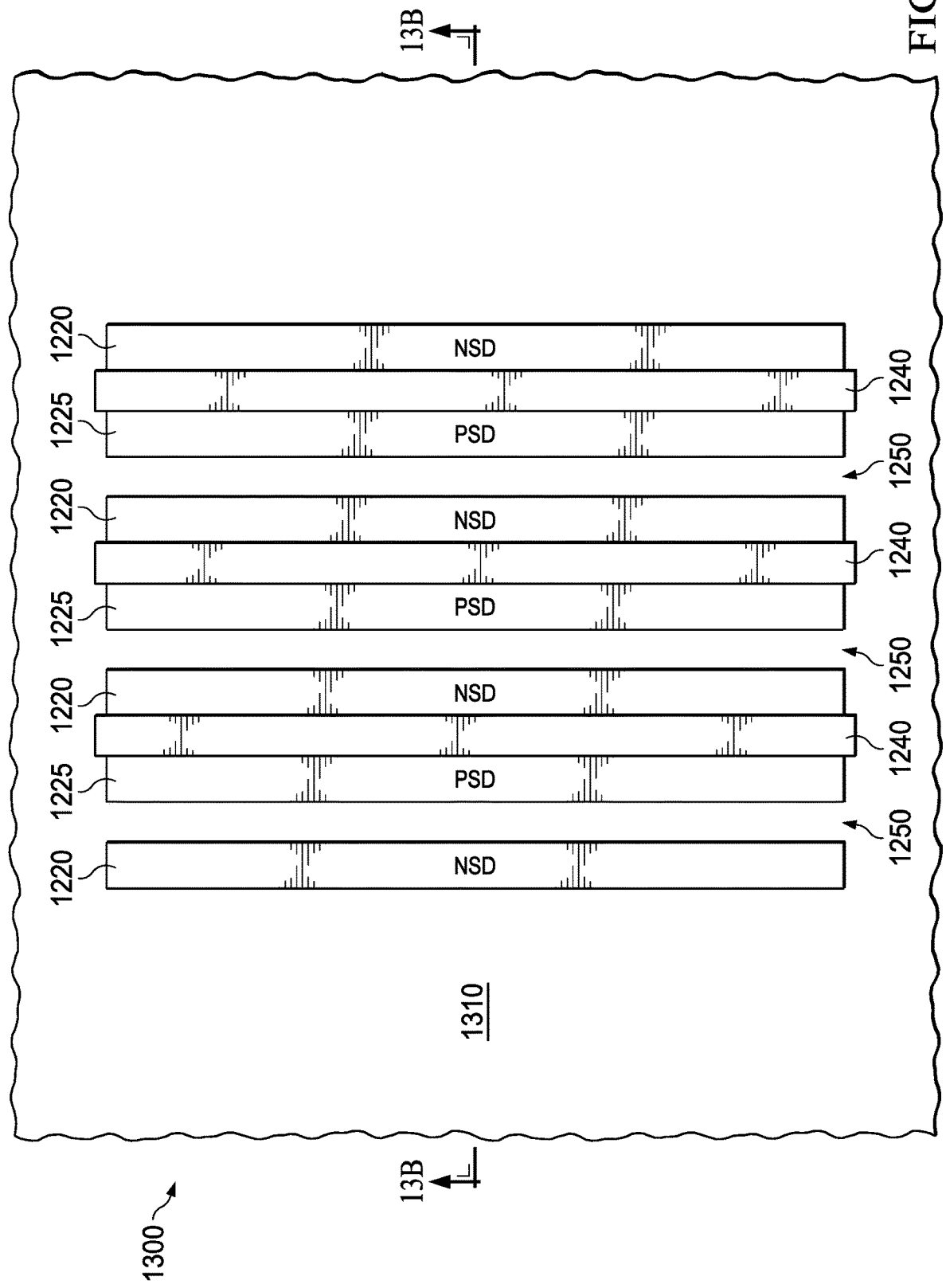
FIGS. 13A and 13B illustrate aspects of an interdigitated diode that implements the hybrid diode element of FIG. 12.
Figure 13B:
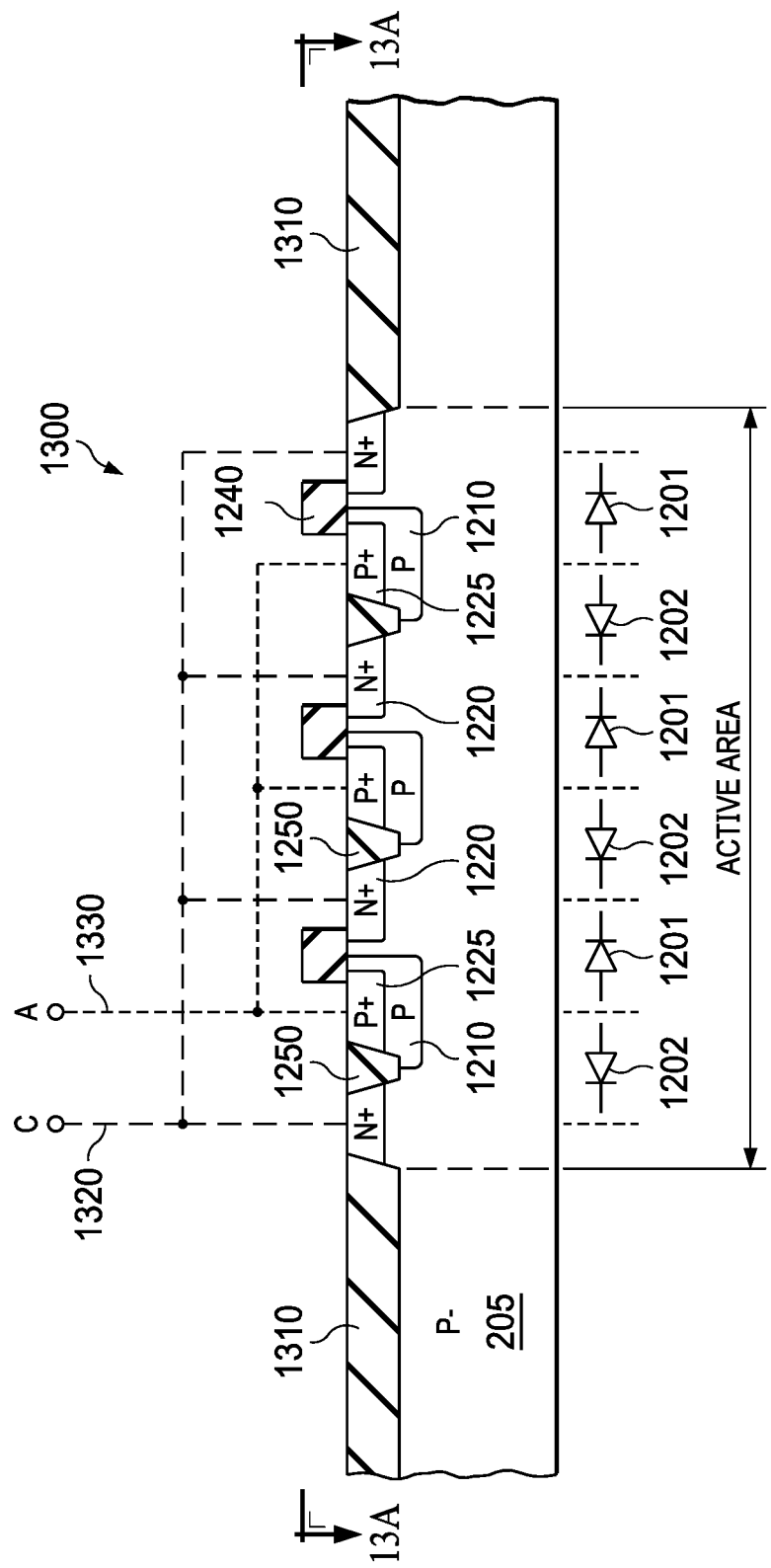

FIGS. 13A and 13B respectively present plan and section view of an electronic device 1300, e.g. a diode, based on the diode element 1200, according to one example embodiment. Both views are described concurrently in the following discussion. The device 1300 may be used in any suitable application, e.g. ESD protection. Unlike the device (diode) 1100, however, distributed STI-spaced diodes operate in parallel with SiBLK-spaced diodes. This configuration may be beneficial in some implementations such as in some CMOS process in which the STI spacing may be scaled to be smaller than the SIBLK spacing, allowing more diode area to be placed in a given diode footprint. The SIBLK-spaced diode portion may provide reduced overshoot during turn-on of the diode 1300, while the STI-spaced diode portion may increase the current carrying capability of the diode 1300.

Similar to the device 1100, alternating NSD regions 1220 and PSD regions 1225 are formed in the substrate 1205. The PSD regions 1225 are shown in FIG. 13B located within optional p-wells 1210. An SiBLK spacer 1240 is located between each PSD region 1225 and only one neighboring NSD region 1220. An STI dielectric strip, designated 1250 for consistency with FIG. 12, is located between each PSD region 1225 and the other neighboring NSD region 1220.

STI dielectric strips 1250 may simply be a portion of a field dielectric 1310 that surrounds the device 1300. In similar fashion to FIG. 11B, FIG. 13B schematically shows diode elements 1201, 1202 with anodes connected by virtue of shared PSD regions 1225, and cathodes connected via shared NSD regions 1220. Each NSD region 1220 may be connected to a cathode terminal 1320 by conventional interconnects, and each PSD region 1225 may be similarly connected to an anode terminal 1330.

Figure 4E:
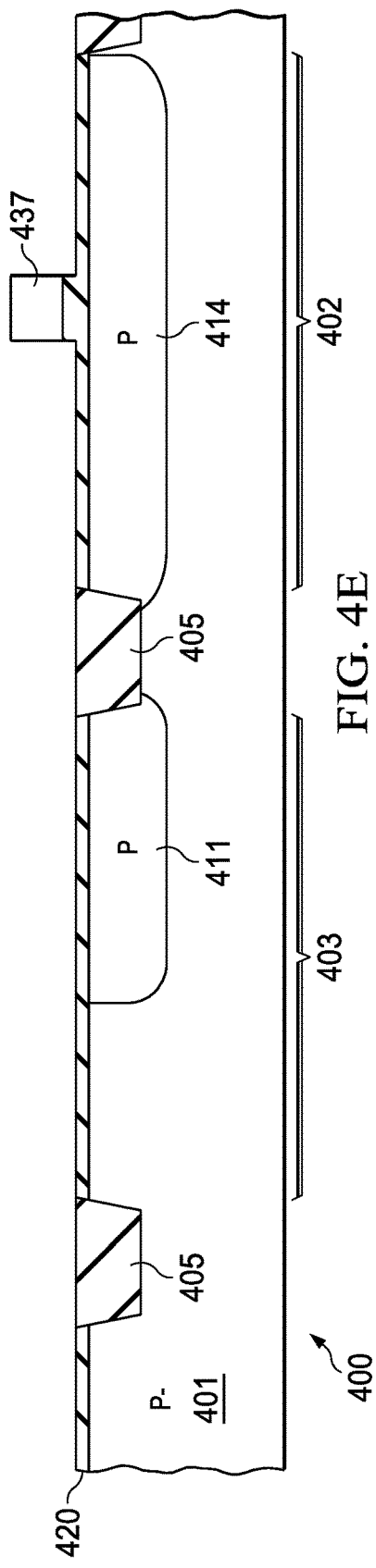
FIGS. 4A-4N illustrate an embodiment of a method in various stages of forming an integrated circuit including a dielectric-spaced diode in a p-type substrate, e.g. the diode element of FIG. 2.
Figure 4F:
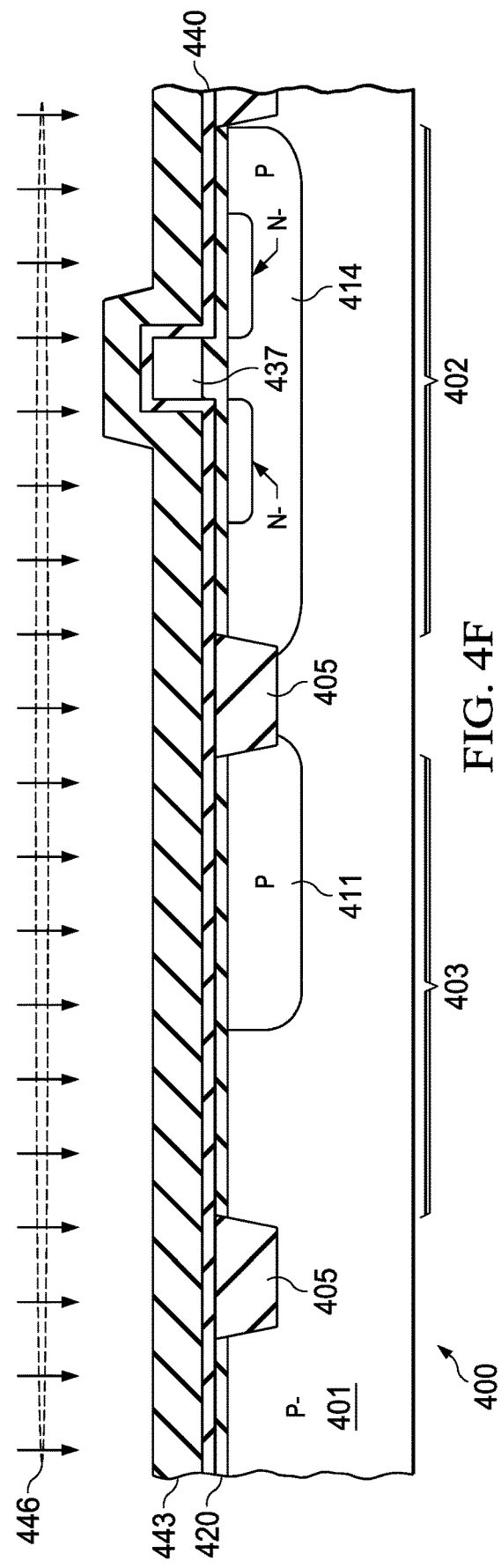
Figure 4G:
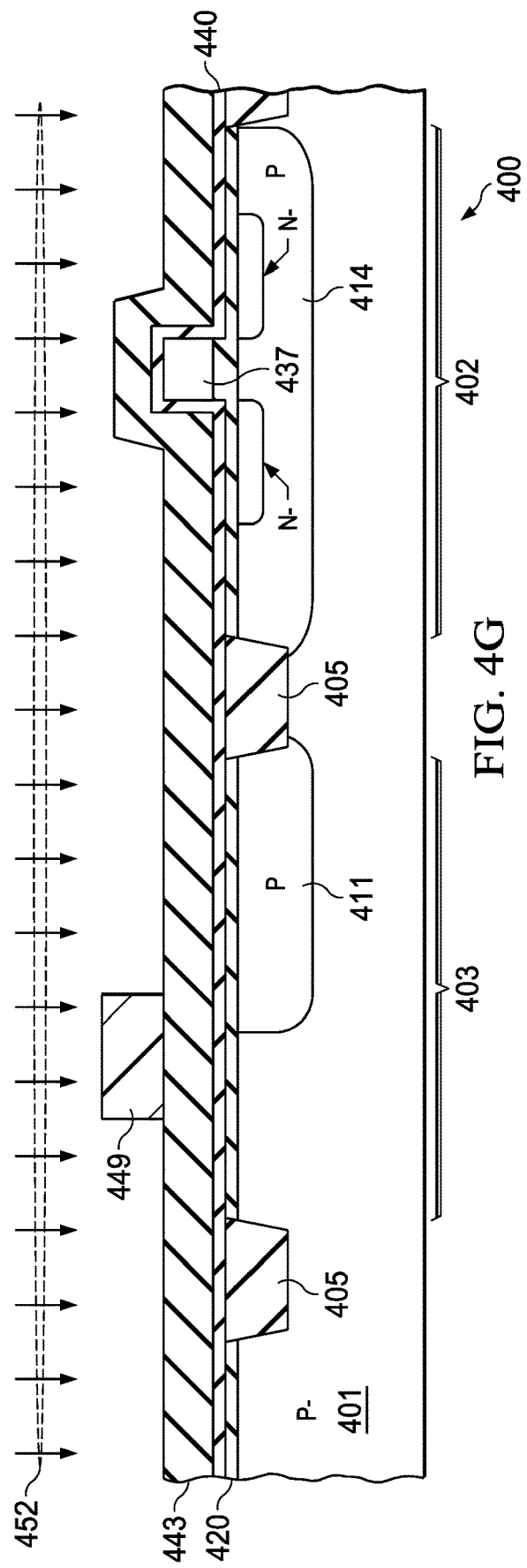
Figure 4I:
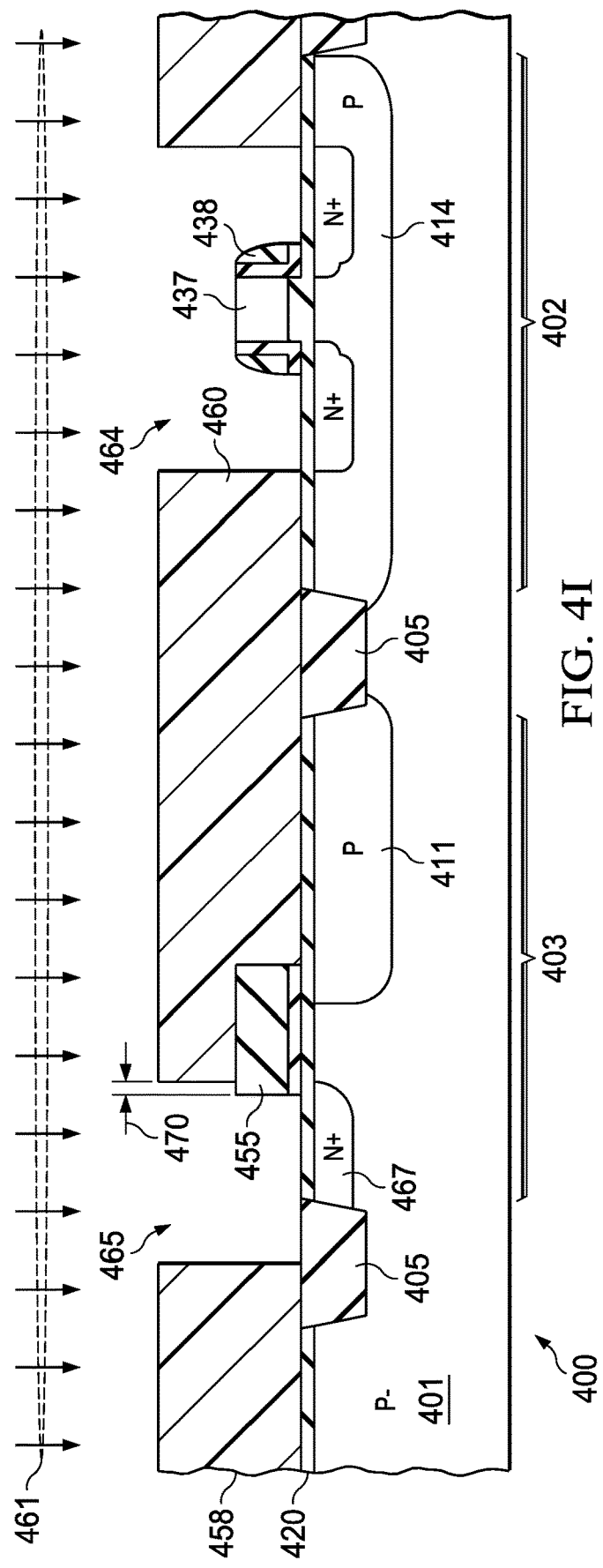
Figure 4J:
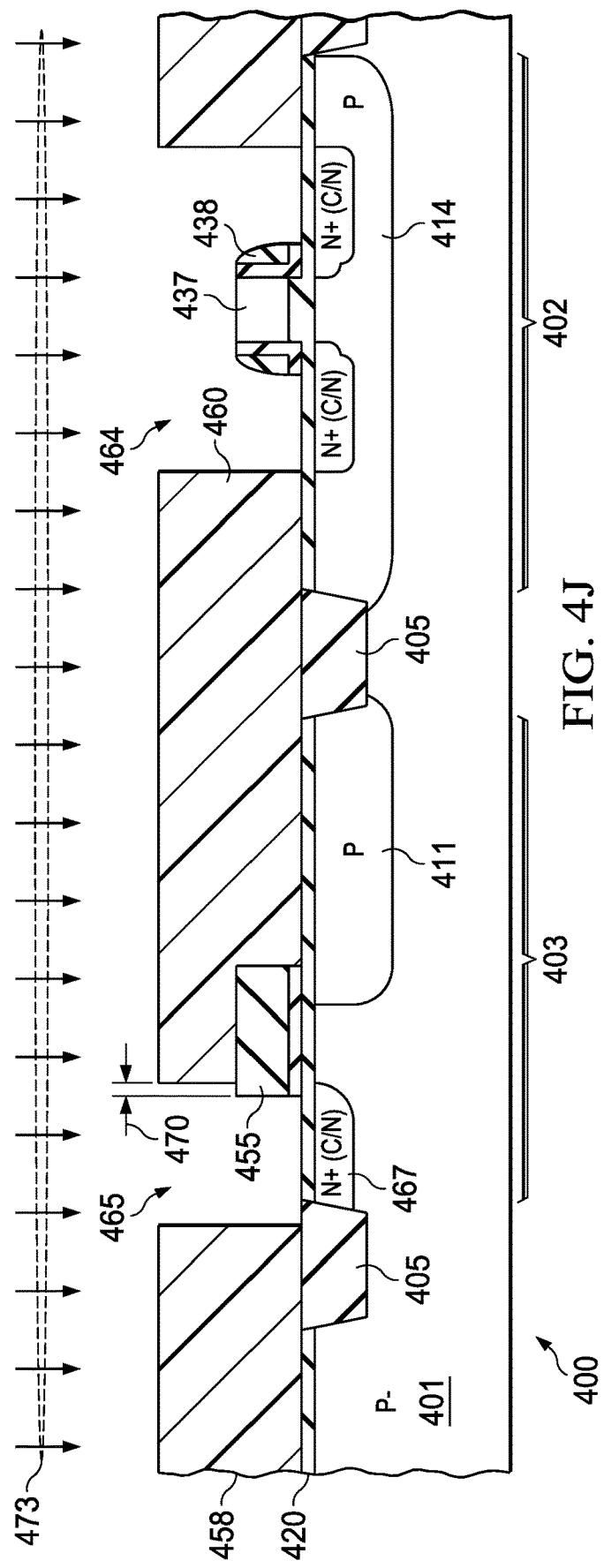
Figure 4K:
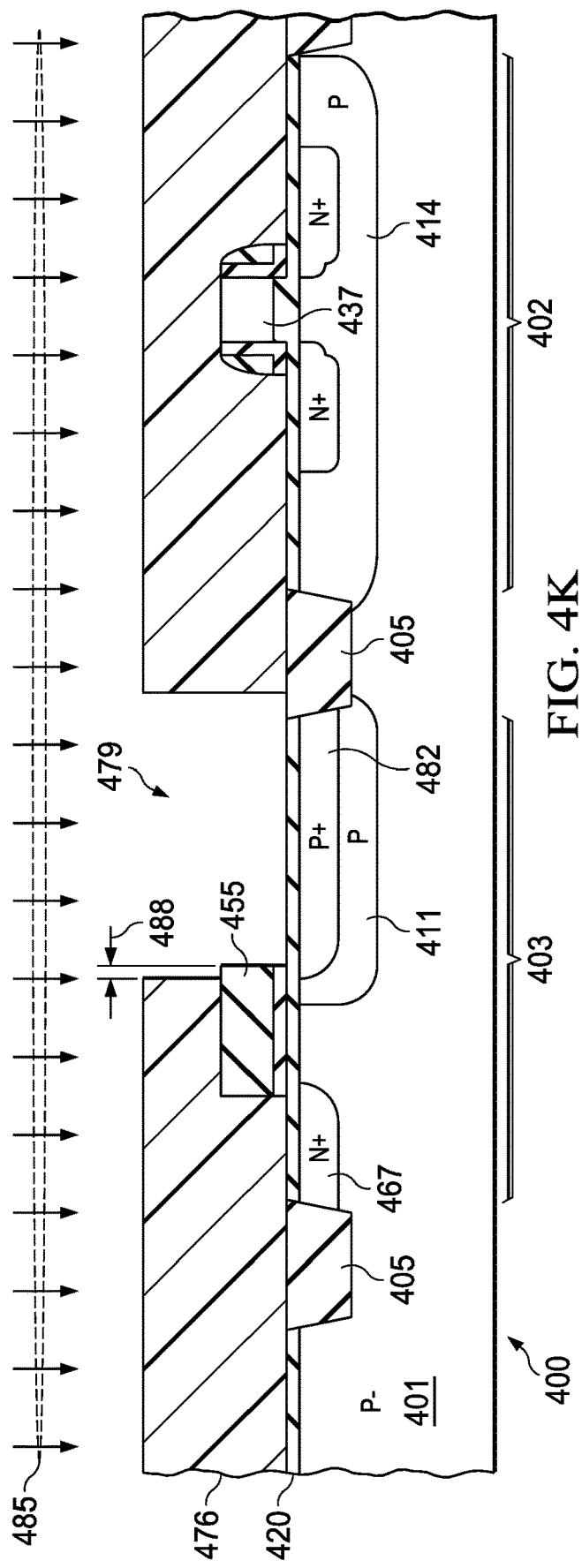
Figure 4N:
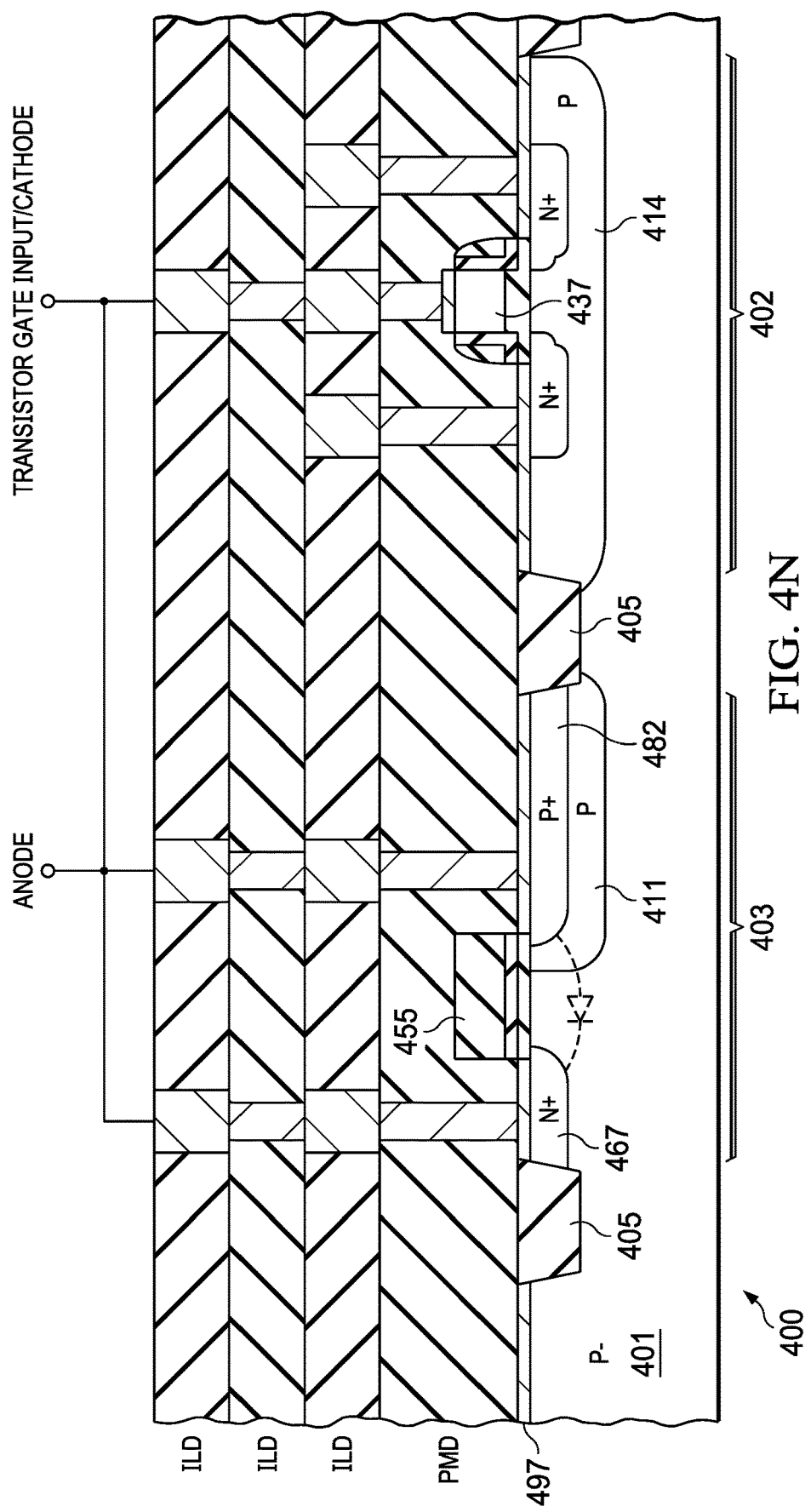

Turning to FIGS. 4A-4N, an embodiment is illustrated of a method, e.g. of forming an electronic device (such as an integrated circuit (IC)) 400 on a substrate 401. The substrate 401 may be a lightly doped p-type silicon wafer, and the following description of the method is consistent with this embodiment. It will be immediately apparent to those skilled in the pertinent art that the described method may be implemented using an n-type substrate with suitable modifications.

Referring to FIG. 4A, a transistor 402 and a diode 403 are shown at an early stage of manufacturing, and isolation (STI) regions 405 have been formed at an earlier processing step. The transistor 402 is described in the following discussion as an NMOS transistor. Those skilled in the art will recognize that the described processes may be modified as appropriate to form a PMOS transistor. A resist layer 408 has been patterned to form openings at which locations p-type regions 411, 414, sometimes referred to as p-wells, 411, 414, are formed. An implant process 417 provides a p-type dopant, e.g. boron, to form the p-wells 411, 414. The resist layer 408 is then removed. In FIG. 4B a thermal oxide layer 420 is formed on the surface of the substrate 401 by an oxidation process 423, e.g. exposure to oxygen and/or steam and/or $N_2O+H_2$ at 800-1200° C. The oxide may be optionally nitrided with plasma nitridation, or grown in $NH_3$ or NO to incorporate nitrogen into the gate dielectric.

FIG. 4C illustrates the IC 400 during deposition of a polysilicon layer 426 by a deposition process 429. The process 429 may be conventional, and the polysilicon layer 426 may have any thickness consistent with the formation of the transistor 402. In FIG. 4D a resist pattern 431 has been formed defining the location of a gate electrode of the transistor 402. However, unlike for a GS-ESD diode, no gate electrode pattern is located over the diode 403, reflecting the absence of the gate structure in embodiments of the SiBLK ESD diode. A suitable etch process 434 removes the unprotected portion of the polysilicon layer 426.

FIG. 4E illustrates the IC 400 after the etch process 434 and subsequent cleanup. A gate structure 437 is located over the p-well 414. The thermal oxide layer 420 has been thinned by the etch process 434, as is typical of some conventional MOS transistor manufacturing flows. Additional processing, not shown, may include thermal oxidation of polysilicon, sometimes referred to as "smile" oxidation. In FIG. 4F, unreferenced n-type source/drain extensions have been formed within the p-well 414 self-aligned to the gate structure 437, and activated by an anneal. The IC 400 is shown after deposition of an optional oxide liner 440 and during formation of a dielectric layer 443 by a deposition process 446. The oxide liner 440 may be formed conventionally, e.g. by plasma deposition using TEOS (tetraethoxysilane) feedstock. The dielectric layer 443 is advantageously formed of a material with slower removal rate than the underlying material layer under some conditions, e.g. a plasma etch process, for removal selectivity. For example, the dielectric layer 443 may include silicon nitride or silicon oxynitride, and may also be formed using conventional methods. (The dielectric layer 443 may be referred to hereinafter for brevity as the dielectric layer 443.) Such materials may be etched preferentially with respect to the underlying oxide layer (thermal oxide layer 420 or oxide liner 440) such that the underlying oxide layer acts as a stopping layer.

The dielectric layer 443 may serve two conventional roles in forming the IC 400. First, the dielectric layer 443 may be etched to produce sidewall spacers on the gate structure 437. Second, silicide block (SiBLK) regions may be formed by pattern and etch to prevent silicide formation on selected portions of the IC 400. In addition to these uses of the dielectric layer 443, the disclosure benefits from the recognition by the inventors that the dielectric layer 443 may be used in a third role, e.g. to block implant of dopants into a portion of the diode 403 to create a self-aligned lateral diode with low capacitance.

FIG. 4G illustrates the IC 400 after formation of a resist pattern 449 defining the location of a dielectric structure over the diode 403. For reasons discussed below, the resist pattern 449 is located over the boundary between the substrate 401 and the p-well 411. An etch process 452, selected as appropriate for the material from which the dielectric layer 443 is formed, removes exposed portions of the dielectric layer 443.

FIG. 4H illustrates the IC 400 after removal of the dielectric layer 443 and subsequent cleanup. Consistent with conventional practice, sidewall spacers 438, which are remaining portions of the dielectric layer 443, are located on the gate structure 437 sidewalls. A gate dielectric layer is located between the gate structure 437 and the substrate 401. Contrary to conventional practice a novel dielectric structure 455, e.g. an implant spacer, is located over the diode 403. The dielectric structure 455 includes a remnant 443' of the dielectric layer 443, a remnant 440' of the oxide liner 440, and an underlying portion 456 of the thermal oxide layer 420. Thus the underlying portion 456 is formed from a same source layer as the gate dielectric layer of the transistor 402. In some embodiments, not shown, the dielectric structure 455 and sidewall spacers 438 may be formed after source/drain implants but before silicidation at a later stage of manufacturing. (See, e.g. FIG. 4M and related discussion, infra.) Such embodiments are further described below.

FIG. 4I shows the IC 400 after formation of an NSD implant mask 458 formed from a photoresist layer. The NSD implant mask 458 defines open areas for implanting, by an implant process 461, a dopant of an opposite conductivity type to the substrate 401, e.g. an n-type dopant such phosphorus. The open areas include an opening 464 over the p-well 414 that defines source/drain (NSD) regions of the transistor 402, and an opening 465 over the diode 403 The NSD implant mask 458 is patterned such that a realized offset 470 is formed between the side of a patterned resist portion 460 and the side of the dielectric structure 455 within the opening 465. The realized offset 470 is discussed in greater detail below. The implant process 461 delivers the dopant to the substrate 401 to form unreferenced source/drain regions within the transistor 402 and an NSD (n-type) region 467 within the diode 403. Without implied limitation, the implant process 461 may provide a flux of phosphorous with a dose of 1e15-1e16 atoms/cm$^2$ at an energy of about 2-10 keV and/or arsenic with a dose of 1e15-1e16 atoms/cm$^2$ at an energy of about 10-50 keV. For these implant conditions, the thickness of the NSD implant mask 458 may be about 240 nm. Considering design choices that may change the dopant dose and energy, the mask 458 thickness may be within a range from about 200 nm to about 500 nm.

In FIG. 4J, stabilizing co-implants may be implanted into the NSD region 467 by an implant process 473 to stabilize the distribution of the n-type dopant implanted by the implant process 461. In various embodiments co-implants of carbon (C) and nitrogen (N) are performed. The co-implants may typically inhibit lateral diffusion of the dopants from the source/drain regions of the transistor 402 under the sidewall spacers 438, thereby improving control of transistor leakage. In a nonlimiting example, the implant flux may be only carbon, only nitrogen, or a mixture of carbon and nitrogen, e.g. in about equal parts, with a dose of carbon and/or nitrogen of 1e14-2e15 atoms/cm$^2$ and an energy in a range from about 1 keV to about 30 keV. Under these conditions, were the resist portion 460 absent over the dielectric structure 455, some carbon and nitrogen may penetrate into the substrate 401 beneath the dielectric structure 455. It is believed that the presence of the carbon and nitrogen in this region will make the dopant profiles steeper near the junction between the NSD region 467 and the p-type substrate 401, leading to higher capacitance at the junction.

To prevent carbon/nitrogen implantation beneath the dielectric structure 455, the resist portion 460 is extended over the dielectric structure 455. In principle it is desirable that the edge of the dielectric structure 455 be coincident with the edge of the overlying resist portion 460. However, the extension of the NSD implant mask 458 past the edge of the dielectric structure 455 may be undesirable, as the resist would block a portion of the n-type dopant into the substrate 401 in the previous implant process 461, distorting the dopant distribution in the NSD region 467, as well as blocking the C/N dopant in the same area. In such a case, the diode would no longer be self-aligned and its I-V characteristics could be highly variable. However, due to alignment tolerances if the mask defining the opening 465 were designed to exactly align the edge of the resist portion 460 with the edge of the dielectric structure 455, in some cases the patterned resist would cover the edge of the dielectric structure 455 and a portion of the substrate 401 within the opening 465.

Therefore, in some embodiments a design offset is set to a nominal alignment tolerance (e.g. $1\sigma$-$3\sigma$) of the mask level used to form the NSD implant mask 458 to the underlying features on the substrate 401, including the dielectric structure 455. In some state-of-the-art photolithography exposure tools, the alignment $3\sigma$ tolerance may be about 80 nm. For such a system the value of the design offset may therefore be set at about 40-80 nm to ensure that the realized offset 470 that results when the NSD implant mask 458 is patterned is no less than about zero, and no greater than about 2×80 nm, or about 55 nm in about ⅔ of alignment events. In some embodiments it may be desirable to target a maximum realized offset 470 that is no greater than about 25% of the width W of the dielectric structure, more preferably no greater than about 10%. (See FIG. 2.) Thus the NSD implant mask 458 covers substantially all of the dielectric structure 455, e.g. at least about 75% of the lateral width. In this manner, any C/N dopant that penetrates the dielectric structure 455 will be essentially limited to the NSD region 467 after a later diffusion process expands the NSD region 467 under the dielectric structure 455. In another aspect, the substrate 401 below the dielectric structure 455 will be essentially free of co-implant dopant ($\lesssim$1E14 atoms cm$^{-3}$) near the NSD/P junction between the laterally opposed sides of the dielectric structure 455. When this condition is satisfied, the substrate 401 under the dielectric structure 455 is considered to be substantially free of the co-implant dopant. This aspect is described further below.

Referring next to FIG. 4K, the IC 400 is shown after removing the NSD implant mask 458, and forming a PSD implant mask 476 with openings at which p-type implants are desired, e.g. to form p-type source/drain regions in PMOS transistors (not shown). An opening 479 is located over the diode 403 at which location a PSD (p-type) region 482 is to be formed. An implant process 485 provides a p-type dopant at an energy and flux consistent with forming p-type source/drain implants, e.g. 1e15-1e16 atoms/cm$^2$ boron at 1-10 keV, thus forming the PSD region 482. For the reasons previously described, a realized offset 488 is designed into the mask from which the PSD implant mask 476 is formed to ensure in most cases that the PSD implant mask 476 does not partially cover the substrate 401 adjacent the dielectric structure 455.

In FIG. 4L co-implants, e.g. carbon and nitrogen, are implanted into the PSD region 482 by an implant process 494. In embodiments for which the dielectric structure 455 and sidewall spacers 438 are formed after source/drain implants, previously described steps 446 (FIG. 4F) and 452 (FIG. 4G) may be performed after the implant process 494 prior to a silicidation step described next.

In FIG. 4M a silicide layer 497, e.g. cobalt silicide, is formed on portions of the substrate 401 that are not protected by the STI regions 405, gate structure 437 and dielectric structure 455. A silicidation process 499 may provide a metallic element, e.g. a transition metal such as Co or Ni, which reacts with the substrate 401 surface to create an ohmic connection to the substrate 401 and various doped regions thereof. Exposed remaining portions of the thermal oxide layer 420 are consumed as a result of the silicidation process 499.

FIG. 4N presents an embodiment of the completed IC 400 including the transistor 402 and diode 403 as described in FIGS. 4A-4M, as well as unreferenced metal interconnect layers, a poly-metal dielectric (PMD) layer and various interlevel dielectric (ILD) layers. In the illustrated configuration the diode 403 may protect the transistor 402 from a negative-voltage ESD strike. Note that the dielectric structure 455 is distinct from the PMD layer. While the scope of contemplated embodiments includes formation of the dielectric structure 455 from a same dielectric material as the PMD, e.g. silicon dioxide, the dielectric structure 455 will be separate and distinct from the PMD in such embodiments by virtue of a material interface, e.g. discontinuity and/or inhomogeneity between the PMD and the dielectric structure 455. Thus, a hypothetical device in which a homogeneous PMD dielectric layer overlies the NSD region 467 and the PSD region 482, and the substrate 401 between these regions, would not fall within the scope of contemplated embodiments and the claims. A diode symbol shown in dashed lines symbolically indicates the orientation of the diode 403 for reference. The PSD region 482 (the anode of the diode 403) is connected to the gate structure 437 by way of vertical and horizontal metallic paths. The NSD region 467 (the cathode of the diode 403) is connected to a vertical metallic path. Of course, the illustrated metallic connections are only one example of how the diode 403 may be connected. In this embodiment the diode 403 may operate to protect the transistor 402 from an ESD strike at the anode. The cathode may be connected to a terminal of a power supply, e.g. +Vcc. If the voltage at the anode exceeds Vcc plus the diode turn-on voltage, then the diode 403 will shunt the ESD current to the power supply terminal. Because the capacitive loading of the cathode at the p-n junction in the diode 403 is reduced in the described embodiments, while maintaining a short diode current path and consequently reduced carrier transit time, the turn-on time of the diode 403 has in some embodiments been found to be shorter, and the voltage overshoot at the anode has been found to be smaller, than comparable conventional ESD protections diodes, e.g. the STI-ESD diode 100 and the GS-ESD diode 150.

Figure 5:
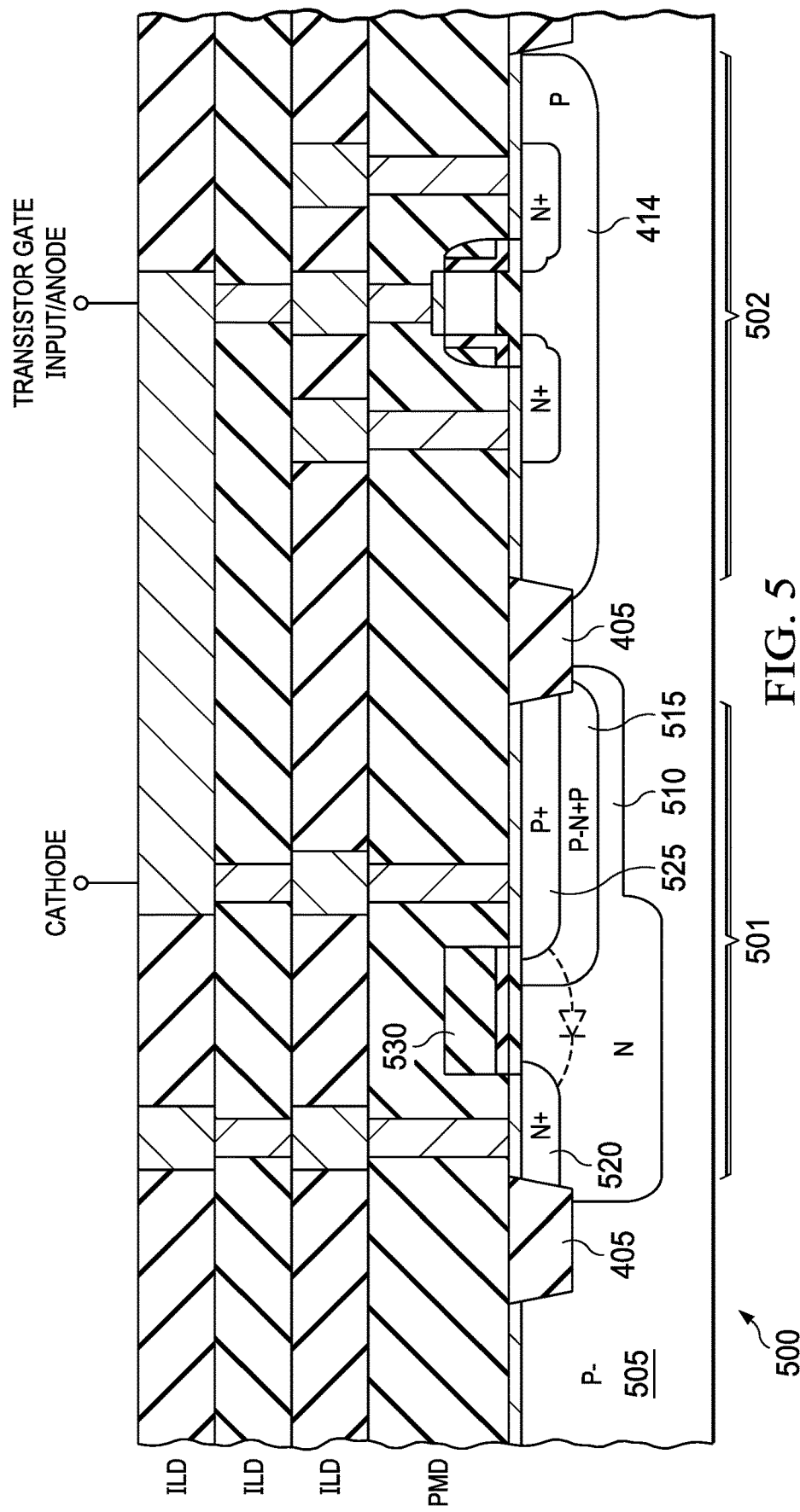
FIG. 5 illustrates an embodiment of an integrated circuit including a dielectric-spaced diode formed in an n-well of a substrate, e.g. the diode element of FIG. 3.

FIG. 5 illustrates an embodiment of an IC 500 in which an ESD protection diode 501 and a MOS transistor 502 are formed in a substrate 505. The diode 501 is implemented using an n-well configuration such as described with respect to embodiments exemplified by FIG. 3. An n-well 510 is formed within the substrate 505, and an optional p-well 515 is formed within the n-well 510. An NSD (n-type) region 520 is located within the n-well 510, and a PSD (p-type) region 525 is located within the p-well 515. A dielectric structure 530 is located with first and second sides located over the NSD region 520 and the PSD region 525, respectively as previously described. The PSD region 525, the anode of the diode 501, is connected by metal interconnects to the gate of the transistor 502, which may also be connected to an I/O terminal of the IC 500. The NSD region 520, the cathode of the diode 501, may be connected to a power supply terminal, thereby providing ESD discharge protection to the transistor 502.

Figure 6:
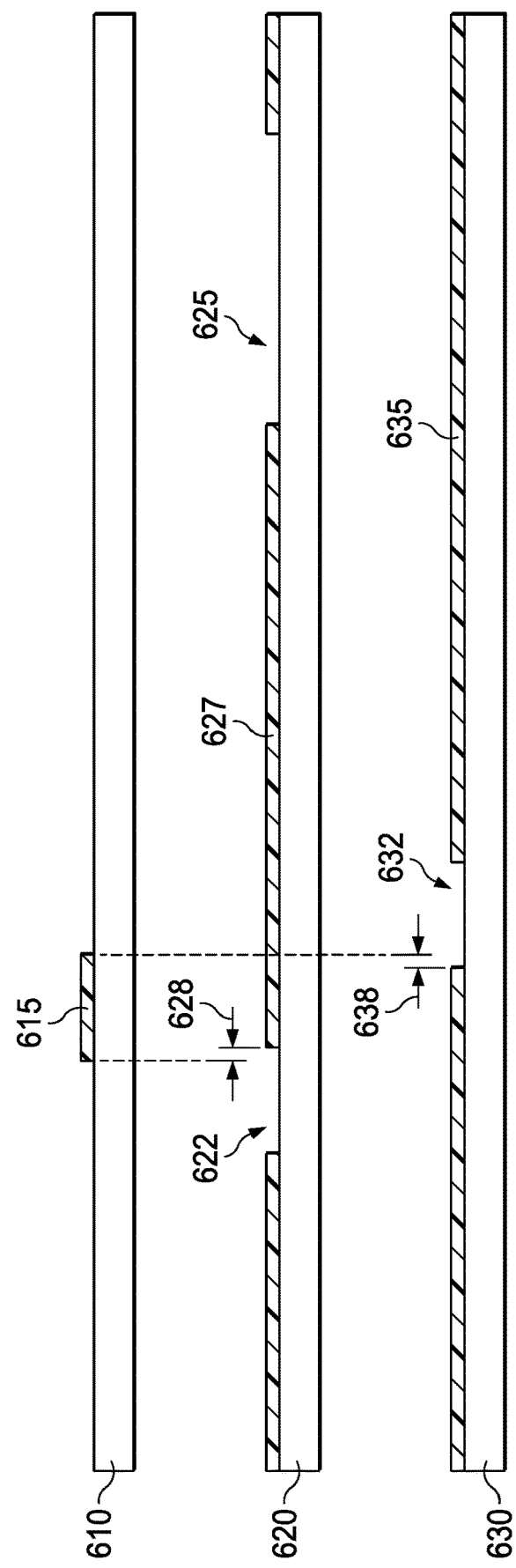
FIG. 6 illustrates photoreticles that implement aspects of the disclosure, e.g. drawn geometries that provide an offset between an edge of the dielectric structure of FIG. 2 and implant masks that form the n-type region and p-type region of FIG. 2.

Returning to the subject of alignment between patterning levels, FIG. 6 illustrates three photoreticles 610, 620 and 630. Without limitation the photoreticles 610, 620 and 630 are illustrated as "positive" masks, such that when used with a positive photoresist will result in the photoresist being removed at locations corresponding to open areas of the respective mask. Each mask includes a glass portion and a metal mask layer, e.g. chrome, shown a darkened line. The photoreticle 610 may be used to pattern the dielectric structure 455, and includes a drawn feature, or geometry, 615 corresponding to the location of the dielectric structure 455. For example, the photoreticle 610 may be used to produce the resist pattern 449 in FIG. 4G.

The photoreticle 620 includes an opening 622 corresponding to the NSD region 467 and an opening 625 corresponding to source/drain regions of the transistor 402. For example, the photoreticle 620 may be used to produce the openings 464 and 465 in the NSD implant mask 458 in FIG. 4J. The photoreticle 620 includes a drawn geometry 627 that defines one side of the opening 622. Similarly, the photoreticle 630 includes an opening 632 that is bordered by a drawn geometry 635. As used herein, a "drawn geometry" may refer to an area of a mask through which light may pass, e.g. the opening 622, or may refer to an area of the mask that blocks light, e.g. the drawn geometry 627, as it is the boundary between masked and open portions of the mask that determine the physical extent of features formed in an integrated circuit. The edge of the drawn feature 627 bordering the opening 622 is offset from the corresponding edge of the drawn feature 615 by a design offset 628. The edge of the drawn feature 635 is offset from the corresponding edge of the drawn feature 615 by a design offset 638

Figure 7A:
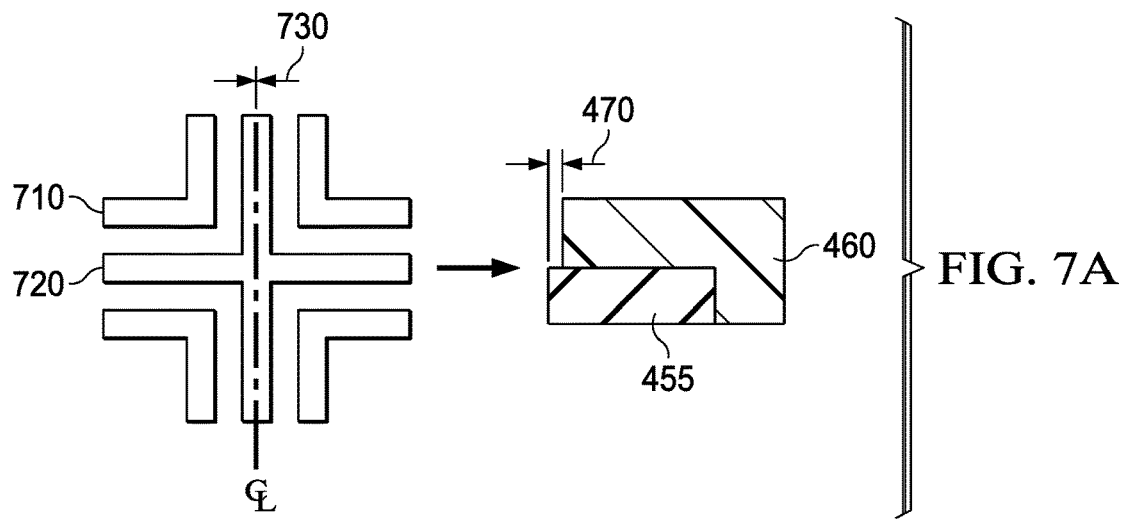
FIGS. 7A-7C illustrate aspects of alignment between levels of the integrated circuit of FIGS. 4A-4I, showing a resulting manufactured offset between the dielectric structure and the implant mask that results from 0, +1σ, and −1σ misalignment between levels.
Figure 7B:
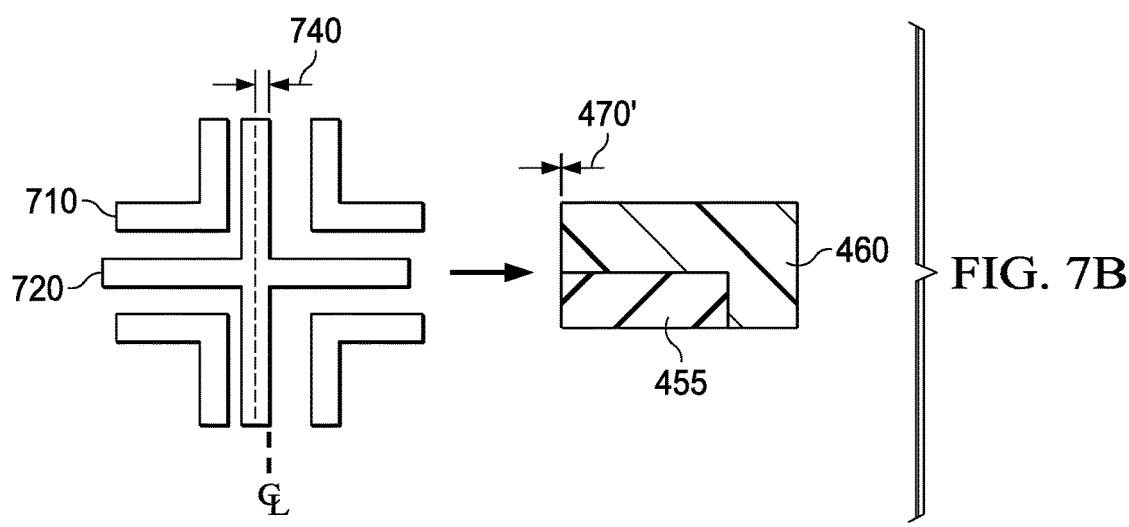
Figure 7C:
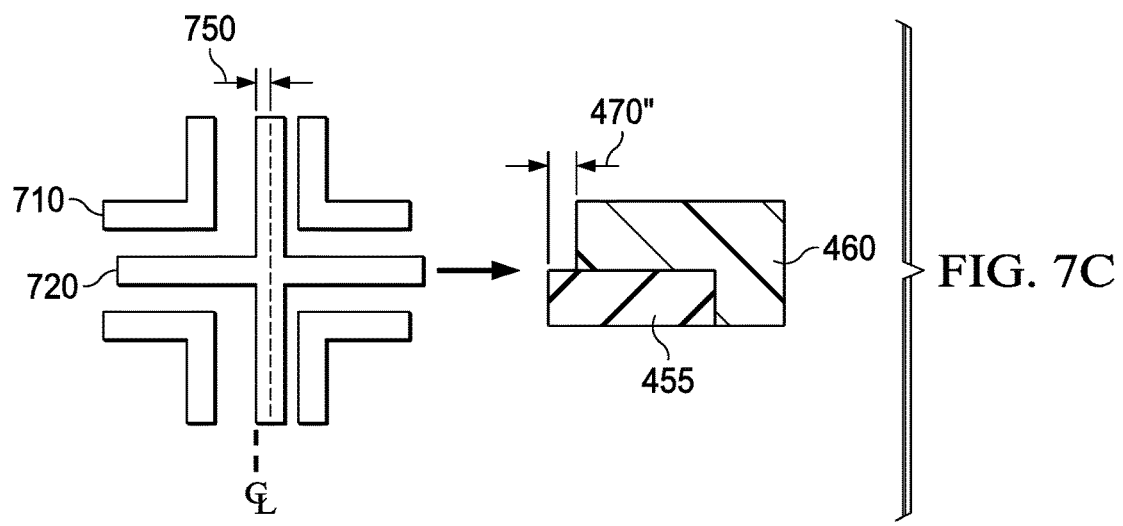

FIGS. 7A-7C show three illustrative alignments that may occur between a photoreticle, e.g. the photoreticle 620 or the photoreticle 630, and a pattern already formed on the substrate 401. In each of FIGS. 7A-7C, the substrate 401 includes an alignment pattern to which the later mask is being aligned, such as a number of chevrons 710 arranged around an origin. For example, the chevrons 710 may be formed in the SiBLK level by appropriate features on the SiBLK photoreticle 610. The chevron pattern is referred to in this discussion as the SiBLK alignment pattern. A later mask, such as the photoreticle 620 or the photoreticle 630, may include a second alignment mark such as a cross 720. The masks are typically designed such that the cross 720 is horizontally and vertically centered between the chevrons 710 when the later mask is perfectly aligned to the SiBLK alignment pattern. A centerline (C) indicates the vertical centerline of the SiBLK alignment pattern, and a dashed line indicates the vertical centerline of the cross 720.

FIG. 7A illustrates perfect alignment, only considering the horizontal direction. When the cross 720 and the SiBLK alignment pattern are aligned, a zero offset 730 exists between the centerline C and the centerline of the cross 720, indicating nominal centering of the mask to the SiBLK features. In this case, the realized offset between the patterned resist portion 460 and the side of the dielectric structure 455 is identically equal to the design offset. As described earlier, the design offset may be about the 1σ value of horizontal misalignment attributable to positional uncertainty of the mask to the substrate 401 in the photo exposure tool.

FIG. 7B illustrates a situation in which the later mask is horizontally offset with respect to the SiBLK alignment pattern. Thus, the cross 720 is horizontally offset to the left with respect to the SiBLK alignment pattern by an alignment offset 740. This offset results in a realized offset 470' between the edge of the resist portion 460 and the edge of the dielectric structure 455. When the design offset and the alignment offset 740 are both 1σ, the realized offset 470' is identically zero.

On the other hand, FIG. 7C illustrates the situation in which the later mask is horizontally offset to the right with respect to the SiBLK alignment pattern by the design offset value. In this case a realized offset 470" results between the edge of the resist portion 460 and the edge of the dielectric structure 455. When the design offset and an alignment offset 750 are both 1σ, the offset 470' is 2σ. Assuming the misalignment between the alignment patterns is normally distributed, about ⅔ of alignments will fall between zero offset of FIG. 7B and 2σ offset of FIG. 7C. In about ⅓ of the alignments the offset between the masks may exceed 1σ, and in about half of these cases, the resist portion 460 may cover the edge of the dielectric structure 455. However, it is expected that with the design offset set to 1σ, such overlap will have a negligible impact on yield of diodes described herein. Thus, while embodiments are not limited to a design offset value of 1σ, this value is thought to provide a reasonable balance between competing manufacturing concerns.

Figure 8:
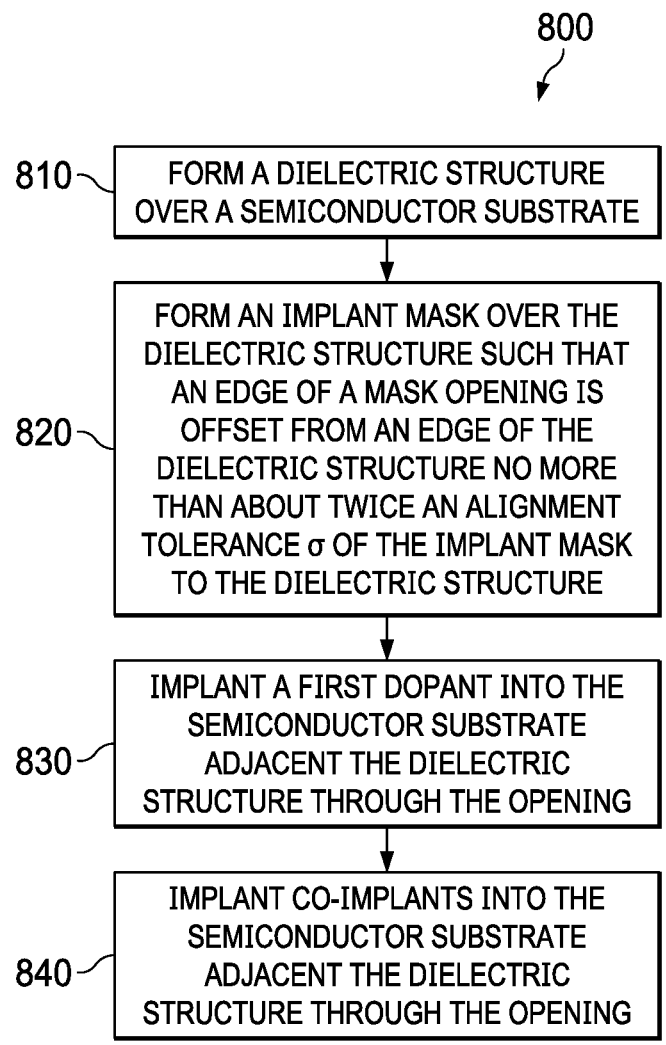
FIG. 8 illustrates an embodiment of a method, e.g. of forming a diode according to embodiments described herein.

FIG. 8 summarizes some relevant aspects of the process flow of FIGS. 4A-4N in a method 800. In a step 810, a dielectric structure, e.g. the dielectric structure 455, is formed over a semiconductor substrate such as the substrate 401. In a step 820 an implant mask, e.g. the NSD implant mask 458, is formed over the dielectric structure. The implant mask is formed such that a portion of the implant mask covers the dielectric structure. An edge of the implant mask is located no more than about 3σ from the edge of the dielectric structure, where a represents one standard deviation of the alignment tolerance of the photo exposure tool used to form the implant mask. In a step 830 a first dopant is implanted into the substrate adjacent the dielectric structure through an opening in the implant mask of which the implant mask edge forms one side. In a step 840 stabilizing co-implants are implanted into the substrate adjacent the dielectric structure through the opening.

Figure 9:
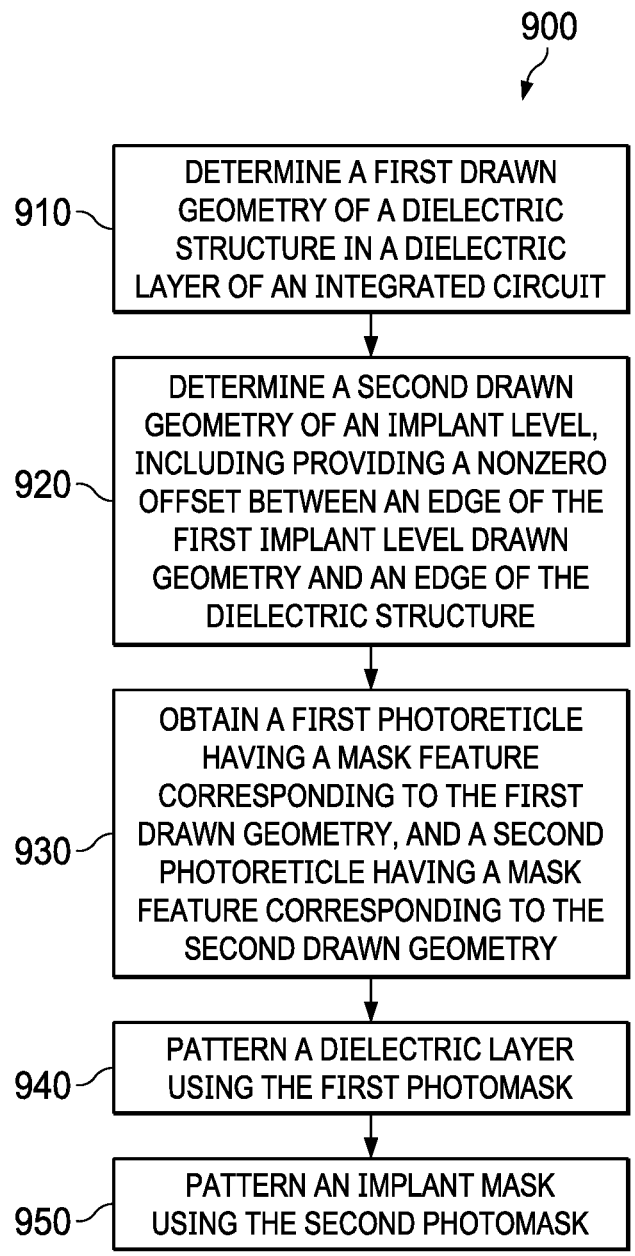
FIG. 9 illustrates an embodiment of a method, e.g. of obtaining photoreticles configured to implement a design offset between the dielectric structure and an implant mask opening.
Figure 10:
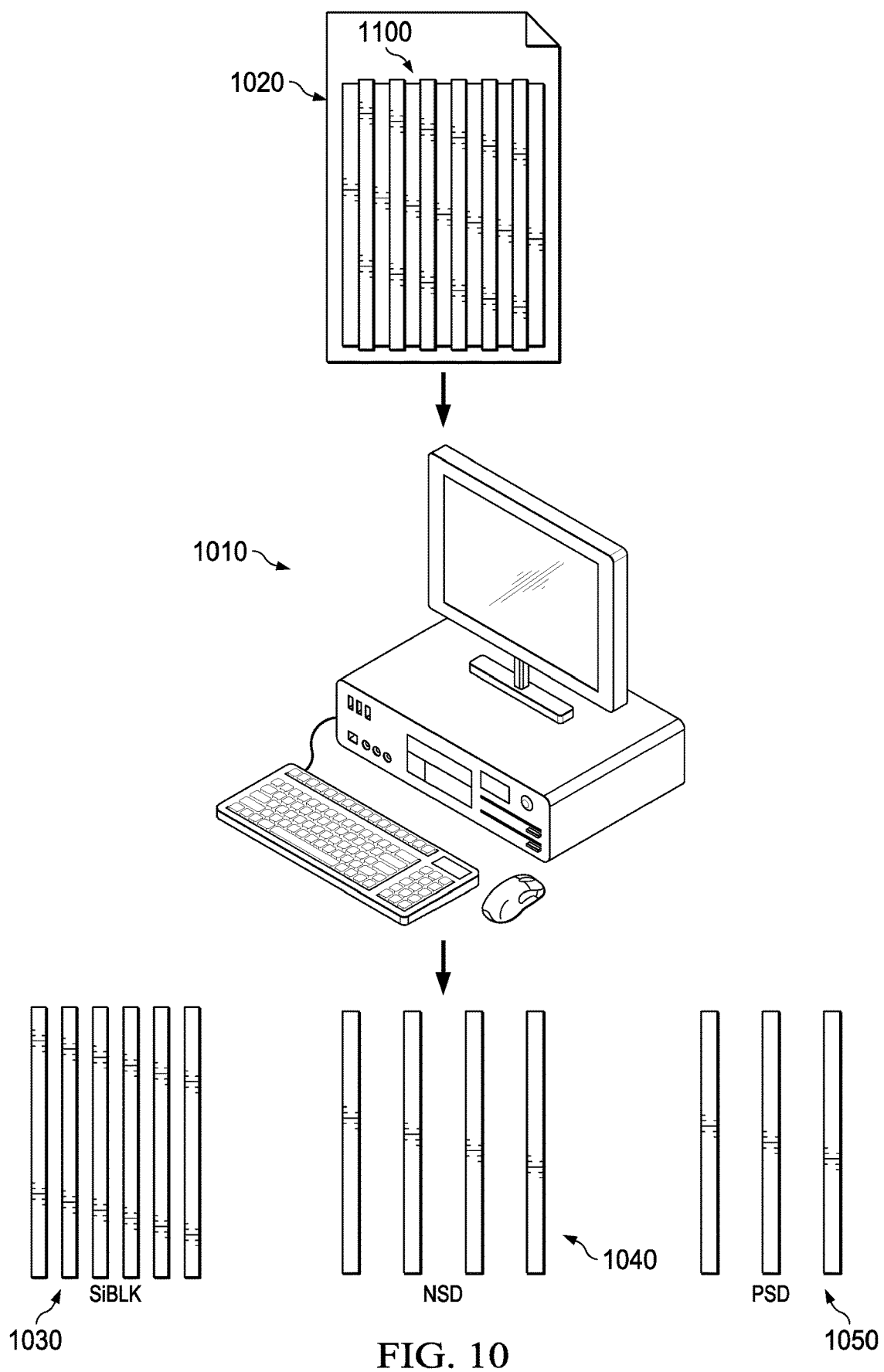
FIG. 10 illustrates aspects of producing design geometries that implement the design offset between the dielectric structure and implant mask opening.

FIG. 9 presents a method 900 that may be used to implement drawn geometries on photoreticles thereby providing the described relationship between a photoreticle and a dielectric structure formed on a semiconductor substrate surface. FIG. 10 illustrates a computer system 1000 that may be suitable to implement the method 900. The method 900 and the system 1000 are described concurrently in the following discussion. The method 900 is described without limitation with reference to the photoreticles 610 and 620 of FIG. 6.

In a first step 910 a first drawn geometry of a dielectric structure is determined. For example, the first drawn geometry may be a geometry that implements the resist pattern 449 (FIG. 4G) that defines the dielectric structure 455 (FIG. 4H). The first drawn geometry, as well as other drawn geometries described below, may include proximity correction or similar features that may improve the fidelity of the intended feature geometry. Thus, when implemented on a photomask, the drawn geometries may differ from the final feature geometry rendered on device substrate.

In a step 920 a second drawn geometry is determined for a first implant level, e.g. the NSD implant. In one example the second drawn geometry implements the NSD implant mask 458 (FIG. 4I) that defines the NSD region 467. In another example the second drawn geometry implements the PSD implant mask 476 (FIG. 4K) that defines the PSD region 482. The second drawn geometry includes a nonzero design offset between an edge of this drawn geometry and an edge of the first drawn geometry, as exemplified by the design offsets 628 and 638 (FIG. 6).

In a step 930, a first photomask is obtained that has a feature corresponding to the first drawn geometry. A second photomask is obtained that has a feature corresponding to the second drawn geometry. In this context, "obtain" means the photomask may be produced by a same first entity that determines the drawn geometries in steps 910 and 920, or may be produced by a second entity and made available to the first entity, such as by contractual relationship.

In a step 940 the first photomask is used to pattern a dielectric layer over a substrate, e.g. to produce a dielectric structure exemplified by the dielectric structure 455 (FIG. 4H). In a step 950 the second photomask is used to pattern an implant mask layer, e.g. to produce openings through which dopants may be implanted into the substrate adjacent the dielectric structure.

Finally, FIG. 10 illustrates the implementation of steps 910, 920 by a representative computer system 1010. The computer system 1010 receives a design file 1020 that includes design elements to be rendered in the physical design of a diode within the scope of the disclosure, represented graphically by the diode 1100. The computer system 1010 includes software designed to translate desired features to be implemented in the circuit design to several photoreticle levels used in the device manufacturing process. Such software may be commercially available, or may be proprietary, and may be conventional with the exception of the steps described herein. The software may produce an output file for use in generating the photoreticle in one of several available formats, e.g. MEBES, GDS-II or OASIS. The computer program that implements the steps 910, 920 of the method 900, and the resulting output files, may be stored locally in the computer system 1010 in a nontransitory computer-readable medium, such as magnetic storage or flash memory, may be stored in a portable nontransitory computer-readable medium for transport, or may be transmitted electronically, e.g. via proprietary LAN (local area network) or the Internet. In the illustrated example, the computer system 1010 produces data sets representing mask levels that include the SiBLK, NSD and PSD levels. Drawn geometry features 1030 may be rendered on a first photoreticle, e.g. the photoreticle 610 (FIG. 6), to pattern the dielectric structures 240 (FIGS. 11A, 11B). Drawn geometry features 1040 may be rendered on a second photoreticle, e.g. the photoreticle 620, to form the NSD implant mask 458 (FIG. 4I) to form the NSD regions 220 (FIG. 11B). Drawn geometry features 1050 may be rendered on a third photoreticle, e.g. the photoreticle 630, to form the PSD implant mask 476 (FIG. 4K) to form the PSD regions 225 (FIG. 11B).

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. An electronic device, comprising:
a semiconductor substrate having a substrate surface;
first and second n-type regions and first and second p-type regions located within the substrate, the n-type regions and the p-type regions each intersecting the substrate surface, the first n-type region located between the first and second p-type regions, and the second p-type region located between the first and second n-type regions;
first and second dielectric structures located over the substrate surface, the first dielectric structure having first and second laterally opposed sides, the first side located over the first n-type region and the second side located over the first p-type region, the second dielectric structure having third and fourth laterally opposed sides, the third side located over the second n-type region and the fourth side located over the second p-type region; and
an STI dielectric located within the substrate between and abutting the first n-type region and the second p-type region.

2. The electronic device of claim 1, wherein the first and second dielectric structures each include a dielectric layer selected from the group consisting of:
silicon nitride;
silicon dioxide; and
silicon oxynitride.

3. The electronic device of claim 1, wherein the first and second dielectric structures each include a gate dielectric layer between an upper dielectric layer and the substrate.

4. The electronic device of claim 1, wherein the electronic device is an integrated circuit and the first and second n-type regions or the first and second p-type regions are connected to an input terminal or an output terminal of the integrated circuit.

5. The electronic device of claim 1, wherein the first p-type region is located within a third p-type region and the second p-type region is located within a fourth p-type region, the first and second p-type regions having a majority carrier concentration different than the third and fourth p-type regions.

6. The electronic device of claim 5, wherein the third and fourth p-type regions are doped with n-type and p-type dopants.

7. The electronic device of claim 5, wherein the first and second p-type regions have a first dopant concentration, the substrate is p-type with a second different dopant concentration, and the third and fourth p-type regions have a dopant concentration between the first and second dopant concentrations.

8. The electronic device of claim 5, wherein the first n-type region is located within an n-well and a portion of the n-well is located between the first n-type region and the first p-type region at the substrate surface.

9. The electronic device of claim 1, wherein the first and second dielectric structures each have a thickness of about 500 nm or less.

10. The electronic device of claim 1, wherein the first and second dielectric structures each have a lateral width of about 500 nm or less parallel to the substrate surface.

11. The electronic device of claim 3, further comprising a MOS transistor having a gate located between source/drain regions formed within the substrate, and a gate dielectric layer between the gate and the substrate, wherein the dielectric structure includes a dielectric layer formed from a same source layer as the gate dielectric layers.

12. A method of forming an electronic device, comprising;
   forming first and second n-type regions and first and second p-type regions within a semiconductor substrate and intersecting a surface of the substrate, the first n-type region located between the first and second p-type regions, and the second p-type region located between the first and second n-type regions;
   forming first and second dielectric structures directly on the substrate surface such that a first side of the first dielectric structure is located over the first n-type region, a second side of the first dielectric structure laterally opposite the first side is located over the first p-type region, a third side of the second dielectric structure is located over the second n-type region, and a fourth side of the second dielectric structure laterally opposite the third side is located over the second p-type region; and
   forming an STI dielectric within the substrate between and abutting the first n-type region and the second p-type region.

13. The method of claim 12, further comprising implanting a co-implant species into the first p-type region with a resist layer located over the dielectric structure.

14. The method of claim 12, further comprising conductively connecting the first and second n-type regions or the first and second p-type regions to a gate electrode of a MOS transistor located on the substrate.

15. The method of claim 12, wherein the first and second dielectric structures each comprise a respective silicon dioxide layer directly on the surface, and a respective dielectric layer on the corresponding silicon dioxide layer selected from the group consisting of:
   silicon nitride;
   silicon dioxide; and
   silicon oxynitride.

16. The method of claim 12, wherein the first p-type region is located within a third p-type region doped with n-type and p-type dopants.

17. The method of claim 12, wherein the first n-type region has a first dopant concentration and is located within a third n-type region having a second lower dopant concentration.

18. The method of claim 12, wherein the first and second dielectric structures are formed prior to forming the first and second n-type regions and the first and second p-type regions.

19. The method of claim 12, further comprising implanting a co-implant species into the first n-type region through an opening in a resist layer, the resist layer located over the dielectric structure.

20. The method of claim 19, wherein the resist layer covers substantially all of the dielectric structure.

21. The method of claim 19, wherein the resist layer is formed using a photoreticle having a nonzero design offset between a side of the dielectric structure and a drawn feature that defines a side of the opening located over the dielectric structure.

* * * * *